(12) United States Patent
Yamanaka et al.

(10) Patent No.: US 7,283,405 B2
(45) Date of Patent: Oct. 16, 2007

(54) SEMICONDUCTOR MEMORY DEVICE AND SIGNAL PROCESSING SYSTEM

(75) Inventors: Hidetoshi Yamanaka, Saitama (JP); Toshiyuki Nishimura, Kanagawa (JP); Shigeru Atsumi, Kanagawa (JP); Daisuke Yoshioka, Kanagawa (JP)

(73) Assignee: Sony Corporation (JP)

( * ) Notice: Subject to any disclaimer, the term of this patent is extended or adjusted under 35 U.S.C. 154(b) by 192 days.

(21) Appl. No.: 11/126,302

(22) Filed: May 11, 2005

(65) Prior Publication Data

US 2005/0259479 A1 Nov. 24, 2005

(30) Foreign Application Priority Data

| May 18, 2004 | (JP) | ............................. P2004-148080 |
| Sep. 29, 2004 | (JP) | ............................. P2004-284036 |

(51) Int. Cl.
*G11C 7/10* (2006.01)
*G11C 8/06* (2006.01)
*G11C 11/4093* (2006.01)

(52) U.S. Cl. ........................... 365/189.05; 365/185.08; 365/230.08

(58) Field of Classification Search ...................... None
See application file for complete search history.

(56) References Cited

U.S. PATENT DOCUMENTS 4,685,088 A * 8/1987 Iannucci ................. 365/189.02

| 4,888,741 A | | 12/1989 | Malinowski |
| 5,592,435 A | * | 1/1997 | Mills et al. .............. 365/233.5 |
| 5,594,704 A | | 1/1997 | Konishi |
| 5,796,675 A | | 8/1998 | Jang |
| 5,970,020 A | | 10/1999 | Ong |
| 7,091,971 B2 | * | 8/2006 | Morein ....................... 345/422 |

OTHER PUBLICATIONS

EPO Search Report, Oct. 19, 2005.

* cited by examiner

*Primary Examiner*—Amir Zarabian
*Assistant Examiner*—Michael Weinberg
(74) *Attorney, Agent, or Firm*—Rader Fishman & Grauer PLLC; Ronald P. Kananen

(57) ABSTRACT

A semiconductor memory device able to read out data at a high speed continuously, provided with, corresponding to a plurality of banks, current address registers for holding addresses for reading data of cell arrays, reserved address registers able to receive in advance and hold reserved addresses for next read operations from the outside, and bank control circuits for making the current address registers hold reserved addresses held in the reserved address registers, making the data be read out, and making the data latch circuits hold the data when the data read out from the cell arrays of the banks by addresses held in the current address registers and held in the data latch circuits become able to be transferred to the outside, and a signal processing system relating to the same.

25 Claims, 15 Drawing Sheets

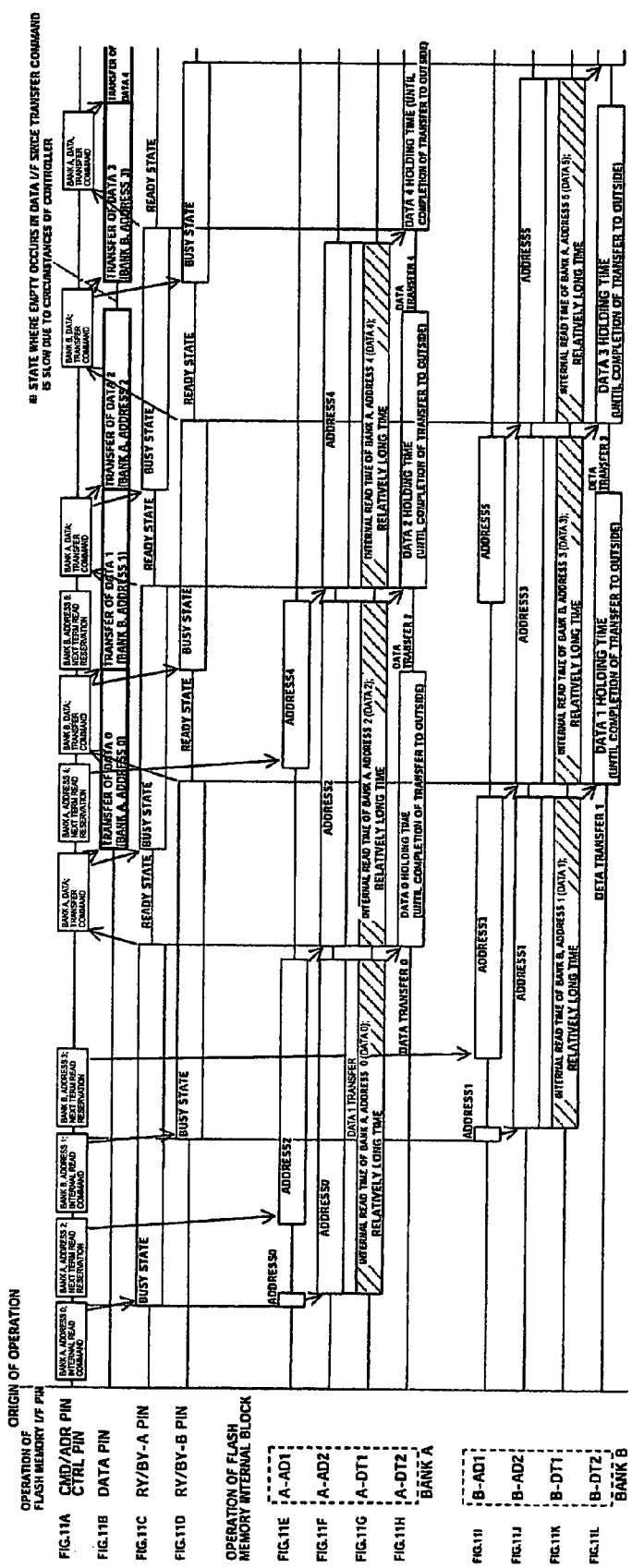

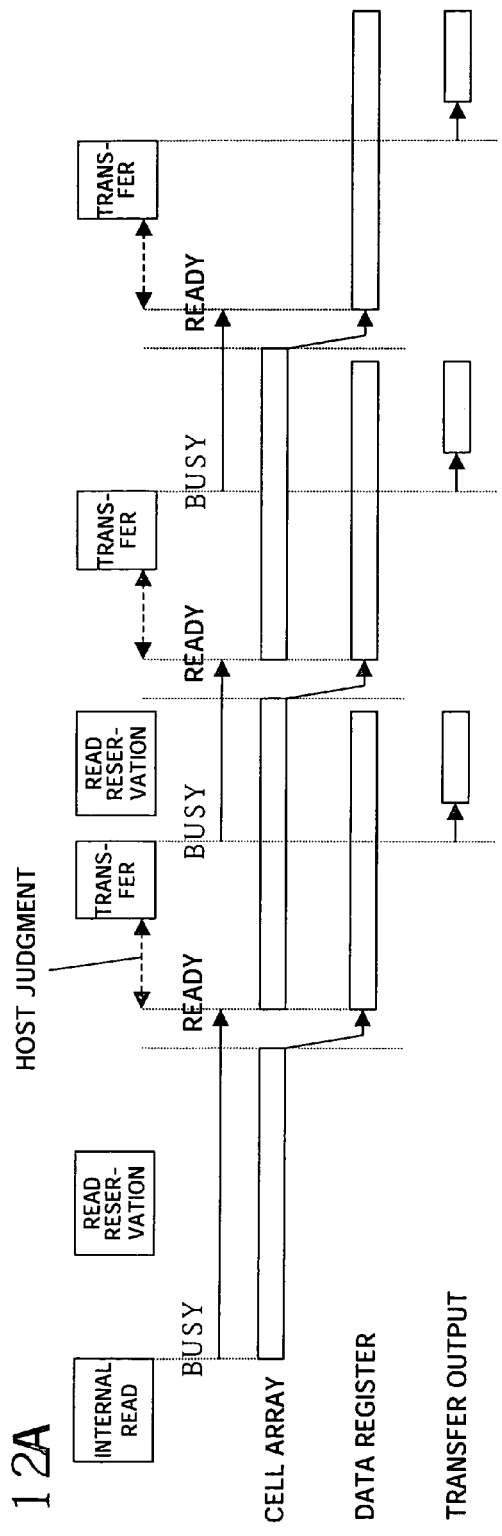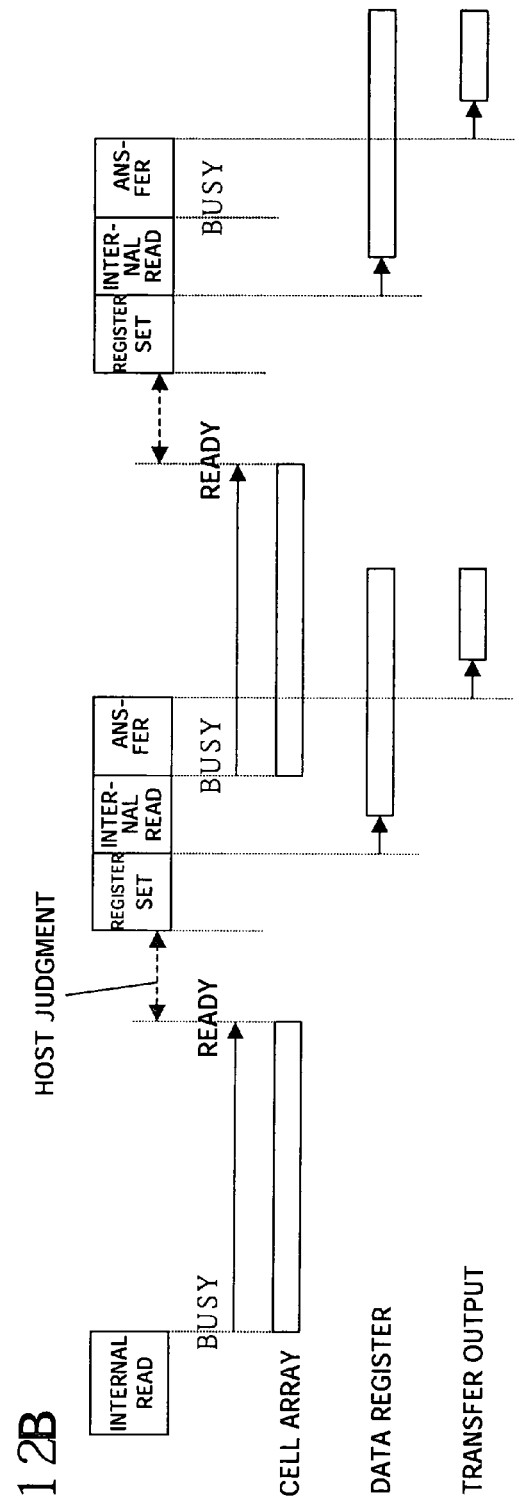

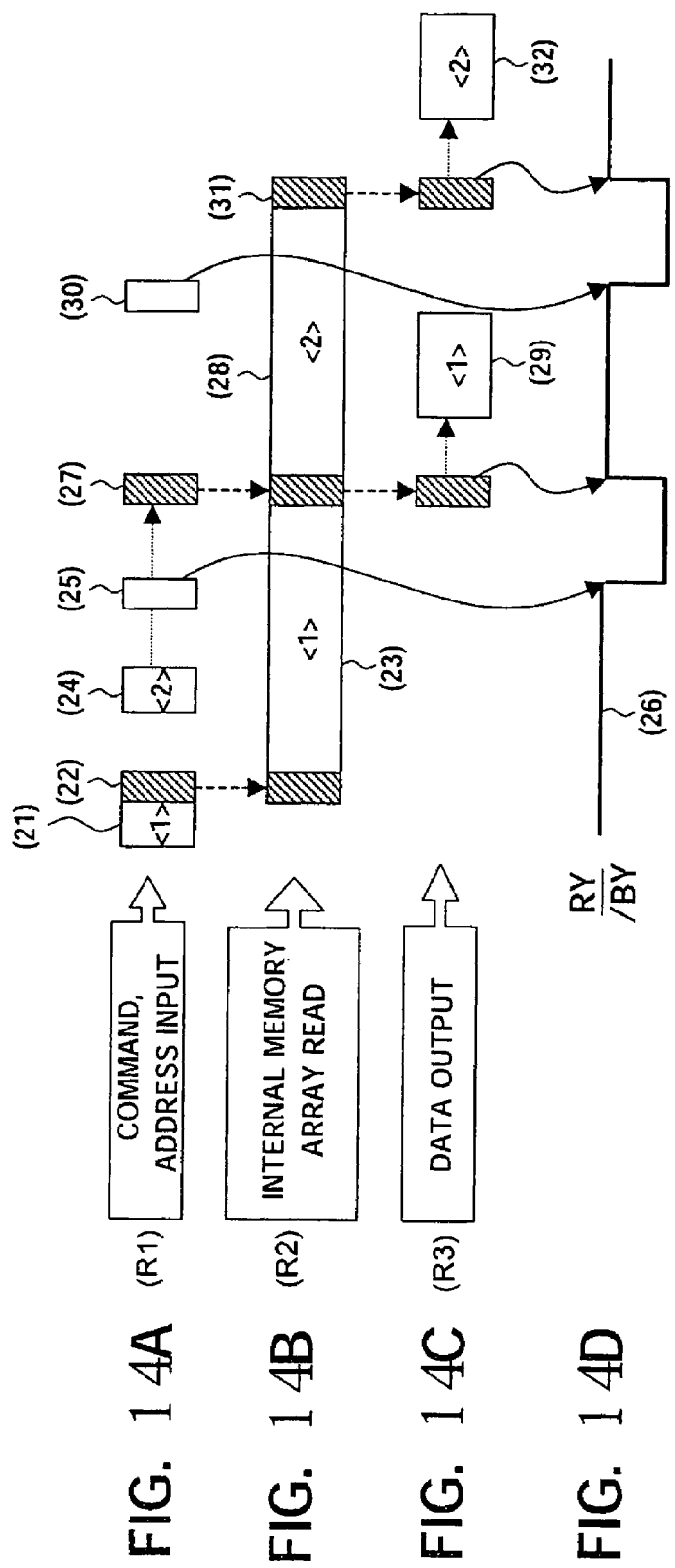

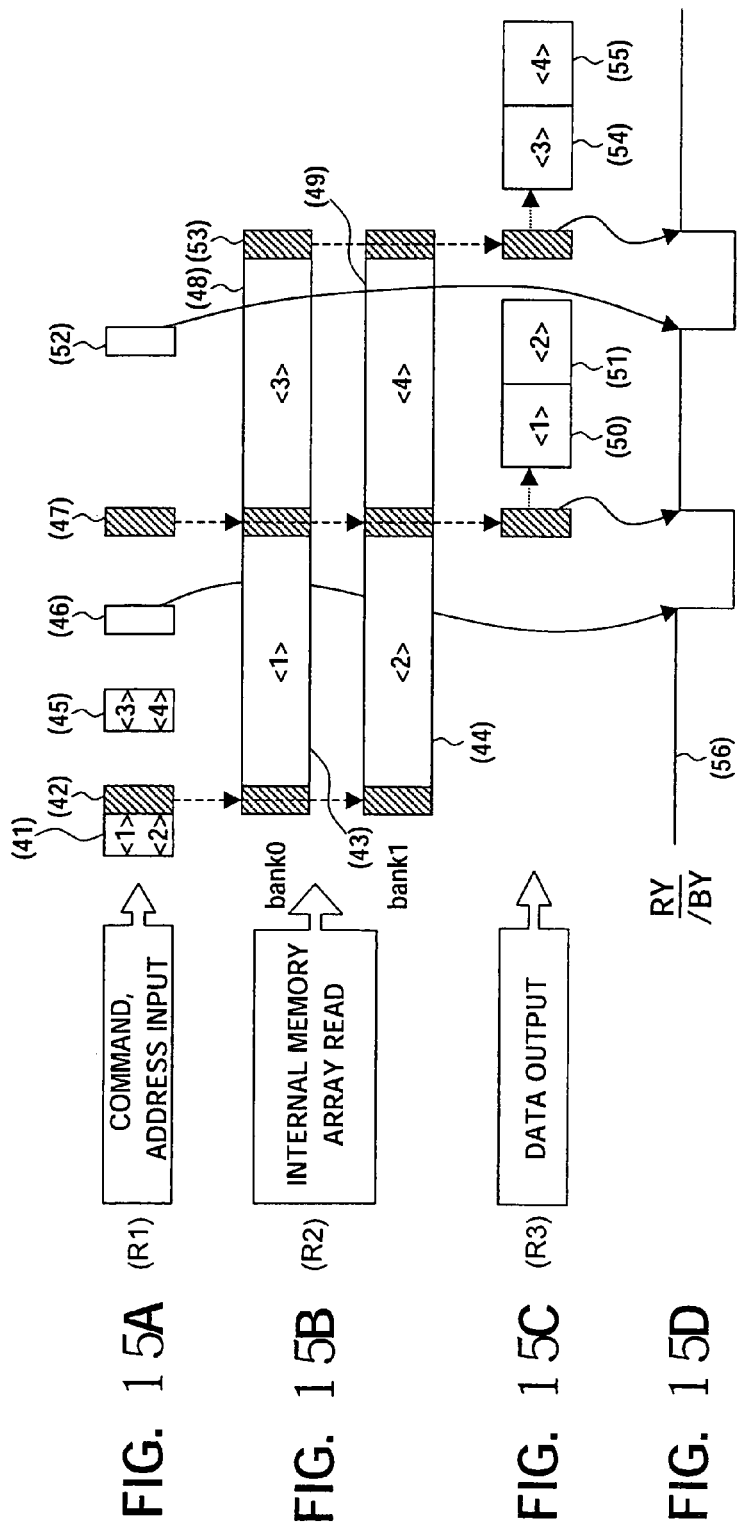

SEMICONDUCTOR MEMORY DEVICE AND SIGNAL PROCESSING SYSTEM

CROSS REFERENCES TO RELATED APPLICATIONS

The present invention contains subject matter related to Japanese Patent Application No. 2004-148080 filed in the Japan Patent Office on May 18, 2004 and Japanese Patent Application No. 2004-284036 filed in the Japan Patent Office on Sep. 29, 2004, the entire contents of which being incorporated herein by reference.

BACKGROUND OF THE INVENTION

1. Field of the Invention

The present invention relates to a NAND type flash memory or other semiconductor memory device having memory strings connected to bit lines and source lines via selection switches and to a signal processing system provided with such a semiconductor memory device, and more particularly relates to an increase of speed of a read operation of a semiconductor memory device.

2. Description of the Related Art

In a NAND type flash memory, a plurality of memory transistors are connected in series to form memory strings. Two memory strings share one bit contact and source line, whereby a higher integration is achieved.

In a general NAND type flash memory, an erase operation is performed by for example applying 0V to all word lines to which a selected memory string is connected, using all word lines to which unselected memory strings are connected as floating states, and applying a high voltage (20V) to the substrate of the memory array. As a result, electrons are drained from the floating gates to the substrate for only the memory transistors of the selected memory string. As a result, the threshold voltages of the memory transistors shift to the negative direction and become for example −3V.

Further, data is written in units of so-called "pages" of several hundred to several thousand bytes for memory transistors connected to the selected word line all together. Specifically, for example, a high voltage (for example 18V) is applied to the selected word lines, 0V is applied to bit lines to which memory transistors into which data is to be written (0 data) are connected, and a high level voltage (for example 3.3V) is applied to bit lines to which memory transistors for which the writing is to be prohibited (1 data) are connected. As a result, electrons are injected into the floating gates for only the selected memory transistors into which the data is to be written. The threshold voltages of the selected memory transistors shift to the positive direction and become for example about 2v.

In such a NAND type flash memory, data is both written and erased by an FN (Fowler Nordheim) tunnel current, so there is the advantage that supply of an operation current from a booster circuit in a chip is relatively easy and operation with a single power supply is easy. Further, since the data is written into the memory transistors connected to the selected word lines all together in units of pages, this is superior to a NOR type flash memory in the point of the write speed.

Further, data is read in a NAND type flash memory in units of randomly accessed pages by establishing the data stored in the memory cells through sense amplifiers and storing the data in a data register, then serially transferring the page data to the outside in units of 1 or 2 bytes. Specifically, for example, 0V is applied to the selected word lines, and a voltage of about 4V is applied to all unselected word lines. In the case of a NAND type flash memory, a plurality of memory cells are connected in series, therefore a reading current of the memory cells is smaller than that of the NOR type flash memory. Accordingly, the so-called "random access time" for establishing on the data stored in the memory cells through the sense amplifiers is long.

SUMMARY OF THE INVENTION

As explained above, a NAND type flash memory is capable of having data written and erased at relatively high speed. However, general NAND type flash memories have the disadvantage that the read transfer speed is slow due to the following in addition to the long random access time.

In general NAND type flash memories, irrespective of the physical structure of division of the inside of the flash memory into banks, it is only possible to instruct the reading of a page corresponding to a single address from the outside at a time. When the inside of the page corresponding to a certain address finishes being read, the established data is stored in the data register, but it may be impossible to automatically read out the inside of the next page until this data is transferred to the outside. For this reason, even when reading of the next page is instructed from the outside after the transfer of data to the outside, it is necessary to wait for the long random access time again.

Further, interface (I/F) pins of a command/address input and a data input/output are shared, so it may be impossible to access data again during the data input/output.

In the present invention, it is desirable to provide a semiconductor memory device able to read out data continuously at a high speed and a signal processing system using the same.

According to a first aspect of an embodiment the present invention, there is provided a semiconductor memory device comprising a current address holding portion for holding an address for reading data, a cell array formed by memory cells arrayed in a matrix and reading out data in accordance with an address held in the current address holding portion, a reserved address holding portion receiving in advance at least a reserved address for the next read operation from the outside and able to hold the reserved address, a data holding portion able to hold the data read out from the cell array and able to transfer the held data to the outside at a predetermined timing, and a control circuit for making the current address holding portion hold the reserved address held in the reserved address holding portion, making the data be read out, and making the data holding portion hold the same when the data read out from the cell array by the address held in the current address holding portion and held in the data holding portion becomes possible to be transferred to the outside.

Preferably, the control circuit makes the data holding portion transfer the held data to the outside by a control signal when the data held in the data holding portion becomes possible to be transferred to the outside.

Preferably, the control circuit outputs a busy signal indicating a busy state to the outside when preparations for transfer of the read out data have not been completed until the data is read out by the address held in the current address holding portion and it becomes possible for the data holding portion to transfer the held data to the outside by the data holding portion, and the reserved address holding portion is able to hold a reserved address upon receipt of the reserved address from the outside even in the busy state.

Preferably, the control circuit reads out data by the address held in the current address holding portion and outputs a ready signal indicating a ready state when the preparations for the transfer of the read out data to the outside have been completed when the data held in the data holding portion becomes possible to be transferred to the outside.

Preferably, the control circuit transfers the held data from the data holding portion to the outside by a control signal when the data held in the data holding portion becomes possible to be transferred to the outside and it receives a command instructing the transfer of the data to the outside from the outside after outputting the ready signal.

Preferably, the data holding portion includes a first latch circuit for holding the data read out from the cell array and a second latch circuit to which the held data of the first latch circuit is transferred at a predetermined timing and which holds the transferred data and it becomes possible to transfer the read out data to the outside when the data is held in the second latch circuit.

Preferably, the data holding portion includes a first latch circuit for holding the data read out from the cell array and a second latch circuit to which the held data of the first latch circuit is transferred at a predetermined timing and which holds the transferred data and it becomes possible to transfer the read out data to the outside when the data is held in the second latch circuit, and the control circuit outputs the ready signal to the outside when the read out data is held in the second latch circuit and becomes possible to be transferred to the outside.

Preferably, the data holding portion includes a first latch circuit for holding the data read out from the cell array and a second latch circuit to which the held data of the first latch circuit is transferred at a predetermined timing and which holds the transferred data and it becomes possible to transfer the read out data to the outside when the data is held in the second latch circuit, and the control circuit outputs the ready signal to the outside when the read out data is held in the second latch circuit and becomes possible to be transferred to the outside and transfers the held data of the second latch circuit to the outside by a control signal when receiving a command instructing the transfer of the data to the outside from the outside.

Preferably, the device comprises a flag register, the control circuit performs internal processing for internally automatically executing the transfer of an address from the reserved address holding portion to the current address holding portion and the transfer of data from the first latch circuit to the second latch circuit when the data finishes being read from the cell array and starting the read operation of the next data from the cell array, the internal processing is carried out by referring to a value of the flag register set by the previously input reservation command, and the processing is executed only when the flag value is a predetermined value.

Preferably, the device further comprises a status notification pin, and the notification pin enters the busy state in response to an input of a reservation command and enters a ready state in response to execution of the internal processing.

Preferably, even when the data finishes being read from the cell array, the control circuit waits for reservation to the flag register by input of a command before executing the internal processing when no reservation has yet been made to the flag register.

Preferably, the device has a status register able to be accessed from the outside and in which the present operation situation is stored.

According to a second aspect of an embodiment of the present invention, there is provided a semiconductor memory device, comprising a plurality of banks each including a cell array formed by memory cells arrayed in a matrix and reading out data in accordance with an address and a data holding portion able to hold the data read out from the cell array and which becomes possible to transfer the held data to the outside at a predetermined timing and, provided corresponding to each of the plurality of banks, a current address holding portion for holding an address for reading data of the cell array, a reserved address holding portion receiving in advance at least a reserved address for the next read operation from the outside and able to hold the reserved address, and a bank control circuit for making the current address holding portion hold the reserved address held in the reserved address holding portion, making the data be read out, and making the data holding portion hold the same when the data read out from the cell array by the address held in the current address holding portion and held in the data holding portion becomes possible to be transferred to the outside.

Preferably, the bank control circuit corresponding to each bank makes the data holding portion transfer the held data to the outside by a control signal during a period where data is not transferred from another bank to the outside when the data held in the data holding portion becomes possible to be transferred to the outside.

Preferably, the bank control circuit corresponding to each bank outputs a busy signal indicating the busy state to the outside when the preparations for the transfer of the read out data has not been completed until the data is read out by the address held in the current address holding portion and it becomes possible to transfer the held data to the outside by the data holding portion, and the reserved address holding portion corresponding to each bank is able to hold the reserved address upon receipt of the reserved address from the outside even in the busy state.

Preferably, the bank control circuit corresponding to each bank outputs a ready signal indicating the ready state to the outside when the preparations for transfer of the read out data have been completed when the data is read out by the address held in the current address holding portion and the data held in the data holding portion become able to be transferred to the outside.

Preferably, the bank control circuit corresponding to each bank transfers the held data from the data holding portion to the outside by a control signal during a period where data is not transferred from another bank to the outside when the data held in the data holding portion becomes possible to be transferred to the outside and it receives a command instructing the transfer of data to the outside from the outside after outputting the ready signal.

Preferably, the data holding portion of each bank includes a first latch circuit for holding the data read out from the cell array and a second latch circuit to which the held data of the first latch circuit is transferred at a predetermined timing and which holds the transferred data, and it becomes possible to transfer the read out data to the outside when the data is held in the second latch circuit.

Preferably, the data holding portion of each bank includes a first latch circuit for holding the data read out from the cell array and a second latch circuit to which the held data of the first latch circuit is transferred at a predetermined timing and which holds the transferred data, and it becomes possible to transfer the read out data to the outside when the data is held in the second latch circuit, and the bank control circuit corresponding to each bank outputs the ready signal to the outside when the read out data is held in the second latch circuit and becomes possible to be transferred to the outside.

Preferably, the data holding portion of each bank includes a first latch circuit for holding the data read out from the cell array and a second latch circuit to which the held data of the first latch circuit is transferred at a predetermined timing and which holds the transferred data, and it becomes possible to transfer the read out data to the outside when the data is held in the second latch circuit, and the bank control circuit corresponding to each bank outputs the ready signal to the outside when the read out data is held in the second latch circuit and becomes possible to be transferred to the outside and transfers the held data in the second latch circuit to the outside by a control signal during the period when data is not transferred from another bank to the outside when receiving a command instructing the transfer of the data to the outside from the outside.

Preferably, the device comprises a flag register, the control circuit performs internal processing for internally automatically executing the transfer of an address from the reserved address holding portion to the current address holding portion and the transfer of data from the first latch circuit to the second latch circuit and starting the read operation of the next data from the cell array for a bank for which the read operation of data from the cell array is completed, the internal processing is carried out by referring to a value of the flag register set by the previously input reservation command, and the processing is executed only when the flag value is a predetermined value.

Preferably, the device further comprises a status notification pin, and the notification pin enters the busy state in response to an input of a reservation command and enters a ready state in response to execution of the internal processing.

Preferably, even when the data finishes being read from the cell array at any bank, the control circuit waits for reservation to the flag register by input of a command before executing the internal processing when no reservation has yet been made to the flag register.

Preferably, the device has a status register able to be accessed from the outside and in which the present operation situation is stored.

According to a third aspect of an embodiment of the present invention, there is provided a signal processing system, comprising a first semiconductor memory device, a second semiconductor memory device to which stored data of the first semiconductor memory device is read out, a host device for controlling access of the first and second semiconductor memory devices and performing predetermined signal processing according to the data stored in the second semiconductor memory device, and a controller for controlling an access request from the host device to the first semiconductor memory device, wherein the first semiconductor memory device comprises a current address holding portion for holding an address for reading data, a cell array formed by memory cells arrayed in a matrix and reading out data in accordance with an address held in the current address holding portion, a reserved address holding portion receiving in advance at least a reserved address for the next read operation from the outside and able to hold the reserved address, a data holding portion able to hold the data read out from the cell array and able to transfer the held data to the outside at a predetermined timing, and a control circuit for making the current address holding portion hold the reserved address held in the reserved address holding portion, making the data be read out, and making the data holding portion hold the same when the data read out from the cell array by the address held in the current address holding portion and held in the data holding portion becomes possible to be transferred to the outside.

According to a fourth aspect of an embodiment of the present invention, there is provided a signal processing system comprising a first semiconductor memory device, a second semiconductor memory device to which stored data of the first semiconductor memory device is read out, a host device for controlling access of the first and second semiconductor memory devices and performing predetermined signal processing according to the data stored in the second semiconductor memory device, and a controller for controlling an access request from the host device to the first semiconductor memory device, wherein the first semiconductor memory device comprises a plurality of banks each including a cell array formed by memory cells arrayed in a matrix and reading out data in accordance with an address and a data holding portion able to hold the data read out from the cell array and which becomes able to transfer the held data to the outside at a predetermined timing and, provided corresponding to each of the plurality of banks, a current address holding portion for holding an address for reading data of the cell array, a reserved address holding portion receiving in advance at least a reserved address for the next read operation from the outside and able to hold the reserved address, and a bank control circuit for making the current address holding portion hold the reserved address held in the reserved address holding portion, making the data be read out, and making the data holding portion hold the same when the data read out from the cell array by the address held in the current address holding portion and held in the data holding portion becomes possible to be transferred to the outside.

According to an embodiment of the present invention, for example, by providing a plurality of address holding portions in a bank, the next address is previously held in the reserved address holding portion. The data is read out from the cell array according to an address held in the current address holding portion and is held in the data holding portion. Then, when it becomes possible to transfer the read out data to the outside at a predetermined timing, the reserved address held in the reserved address holding portion is held in the current address holding portion. This time the data is read out and held in the data holding portion according to this address. Due to this, it becomes possible to continuously access the data in a time sequence.

Further, for example, by providing a plurality of banks in a flash memory and accessing them in parallel, high speed data transfer is enabled. By providing a plurality of address registers in each bank, it becomes possible to continuously access data in a time sequence. Further, since the banks are operated in parallel, it becomes possible to efficiently access the banks by providing a ready signal/busy signal for each bank and performing a handshake with the outside.

BRIEF DESCRIPTION OF THE DRAWINGS

These and other objects and features of the present invention will become clearer from the following description of the preferred embodiments given with reference to the attached drawings, wherein:

FIGS. 11A to 11L are timing charts for explaining a read operation sequence of a flash memory according to the present embodiment;

FIGS. 12A and 12B are diagrams for explaining an effect of providing an address reservation register;

FIGS. 14A to 14D are diagrams showing an example of a data read operation from a single bank of the flash memory provided with a flag register; and FIGS. 15A to 15D are diagrams showing an example of the data read operation from a plurality of banks of the flash memory provided with a flag register.

DESCRIPTION OF THE PREFERRED EMBODIMENTS

Below, an explanation will be given of preferred embodiments of the present invention with reference to the drawings.

Figure 1:
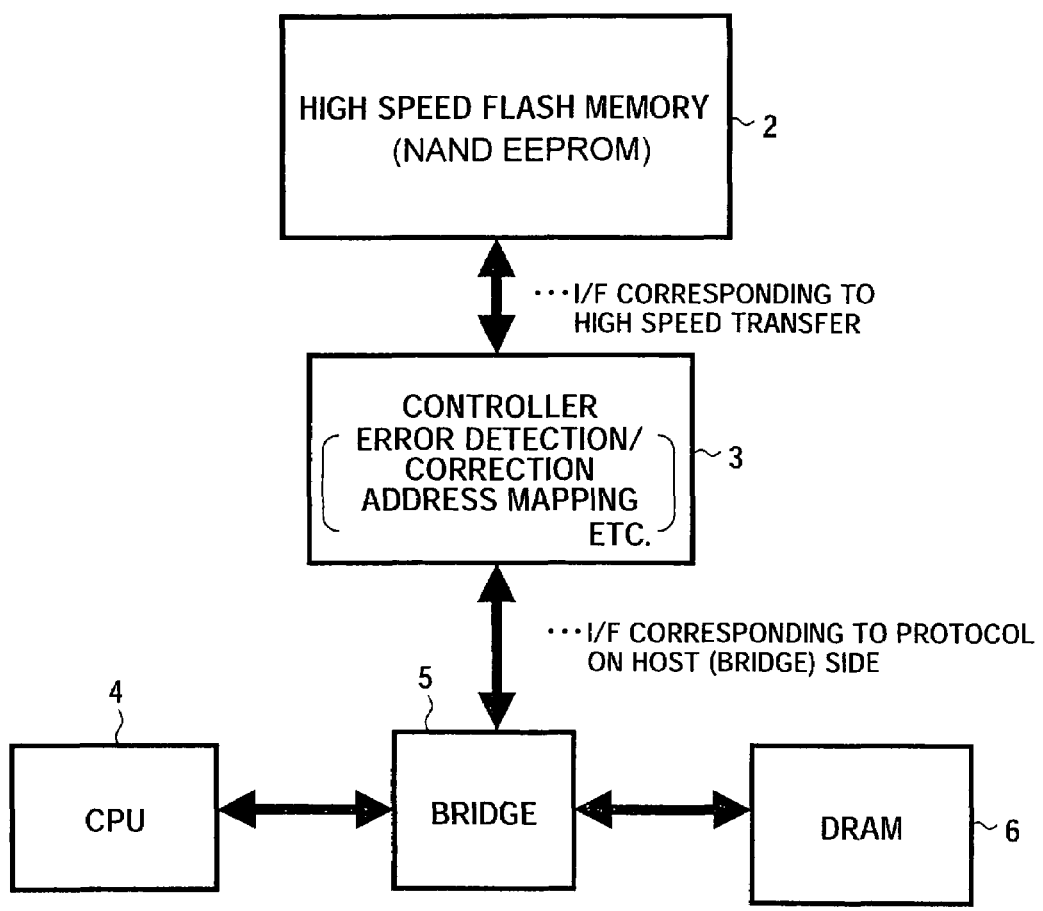
FIG. 1 is a block diagram of the overall configuration of a signal processing system employing a semiconductor memory device according to an embodiment of the present invention.

FIG. 1 is a block diagram of the overall configuration of a signal processing system employing a semiconductor memory device according to an embodiment of the present invention. In the present embodiment, as the semiconductor memory device, a NAND type flash memory in which memory strings formed by connecting pluralities of memory cells in series are connected to bit lines and source lines via selection switches is employed.

The signal processing system 1 has, as shown in FIG. 1, NAND type flash memory 2 as a first semiconductor memory device, a controller 3, a central processing unit (CPU) 4 as a host device, a bridge circuit 5, and for example a dynamic random access memory as a second semiconductor memory device (DRAM) 6.

In the signal processing system 1, the host side CPU 4 and the NAND type flash memory 2 are connected via the controller 3. Access requests from the CPU 4 for read operations and write operations with respect to the flash memory 2 are received once by the controller 3. The controller 3 performs address translation processing (mapping processing for translating a logical address designated by the CPU 4 to a physical address on the flash memory, that is, logical/physical address translation processing), error detection/correction processing with respect to the read data from the flash memory 2, addition etc. of an error detection/correction code for the write data to the flash memory 2, and so on.

This signal processing system 1 makes good use of for example the characteristics of the NAND type flash memory 2. The NAND type flash memory 2 is applied as a storage device of the system's operating system program and application program or a storage device of image or audio data. In the signal processing system 1, at the time the power is turned on, at the time of a forcible reset, or at the time of a system reset, the data stored in the NAND type flash memory 2 is read out at a high speed, for example, a high speed of about 1 GB/s, and transferred through the controller 3 and the bridge circuit 5 to the DRAM 6 at a high speed. After that, the CPU 3 can start up the system at a high speed by accessing the DRAM 6 and can perform various signal processing in accordance with the applications such as image processing, audio processing, or display processing or audio output processing accompanying the same.

The flash memory 2 according to the present embodiment basically has a plurality of banks and issues distinctive commands so as to access a plurality of banks in parallel so as thereby to enable high speed data transfer. By providing a plurality of (two in the present embodiment) address registers corresponding to each bank, continuous access in time sequence is realized. Further, in order to operate the banks in parallel, each bank issues a signal for giving notification of the state of progress of that bank's operation, that is, a ready (RY)/busy (BY) signal, to the controller 3. The controller 3 and each bank shake hands to realize efficient access of each bank. Further, the memory is provided with a plurality of (two in the present embodiment) data registers for storing the already read data from the cell array. By storing the present states of operation in a status register, a system able to maintain a grasp over the states of operation of the different banks is realized.

Below, an explanation will be given focusing on the more specific configurations and functions of the NAND type flash memory 2 and the controller 3 according to the present embodiment.

Figure 2:
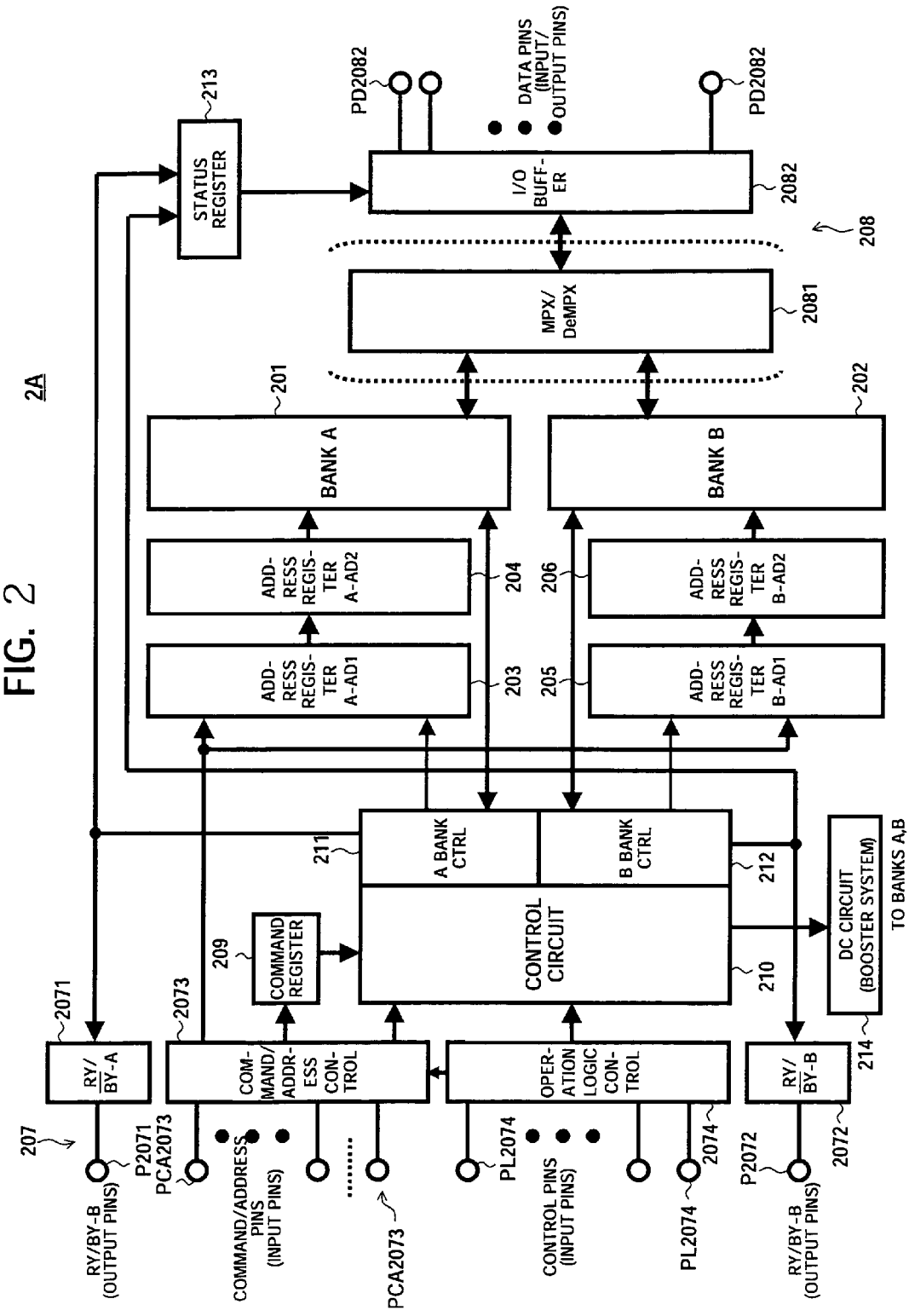
FIG. 2 is a block diagram of an example of the configuration of a NAND type flash memory of FIG. 1.
Figure 3:
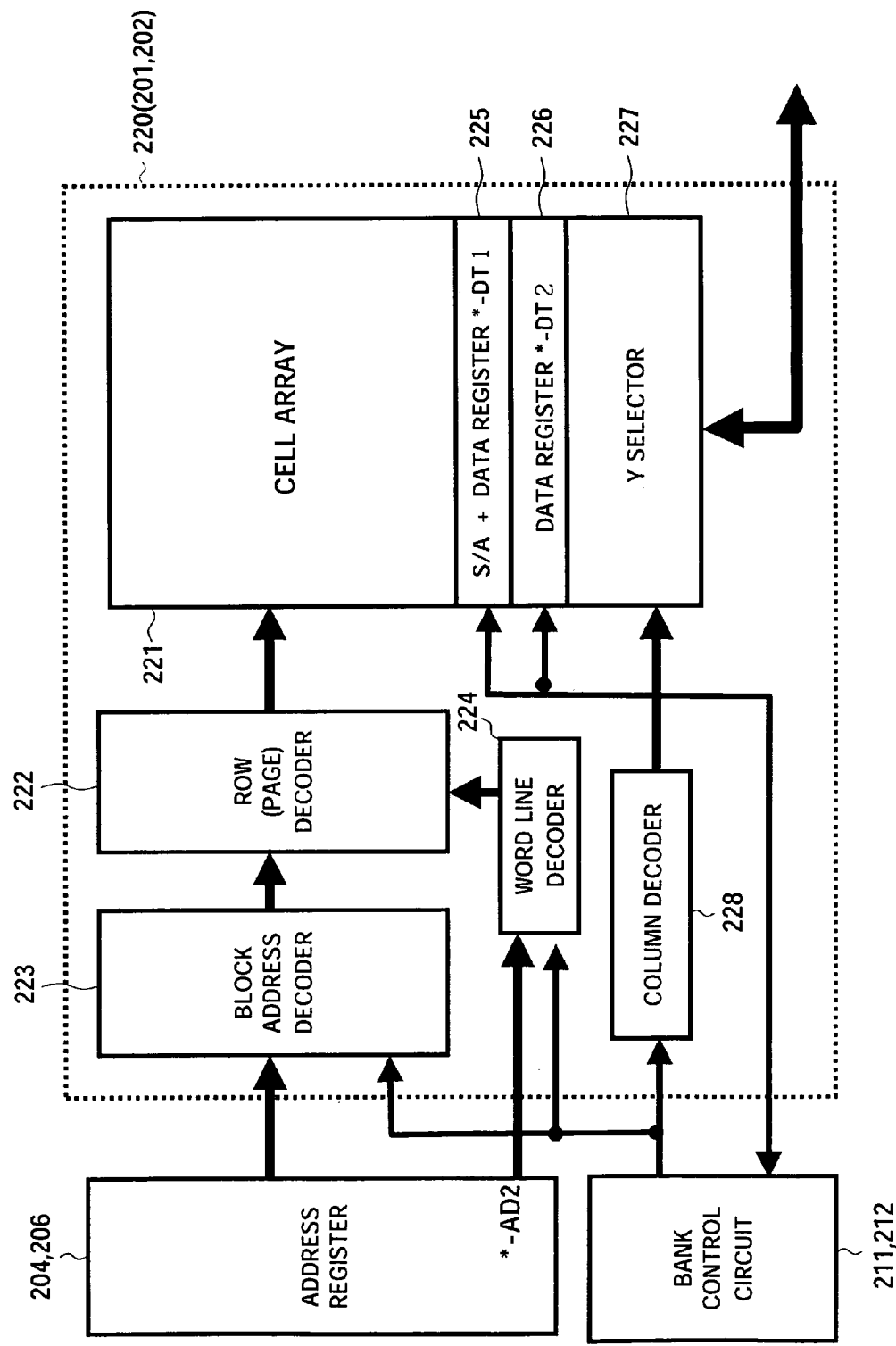
FIG. 3 is a block diagram of a specific example of the configuration of a bank in FIG. 2.

FIG. 2 is a block diagram of an example of the configuration of the NAND type flash memory of FIG. 1. FIG. 3 is a block diagram of a specific example of the configuration of a bank in FIG. 2.

The flash memory 2 of FIG. 2 has, as principal elements, two banks 201(A) and 202(B) including cell arrays, two address registers 203 (A-AD1) and 204 (A-AD2) serving as address holding portion provided corresponding to the bank (A) 201, two address registers 205 (B-AD1) and 206 (B-AD2) serving as address holding portion provided corresponding to the bank (B) 202, a control system signal input/output portion 207, a data input/output portion 208, a command register 209, a control circuit 210 for controlling the access to the two banks 201 and 202, a first bank control circuit 211 for controlling the bank (A) 201, a second bank control circuit 212 for controlling the bank (B) 202, a status register 213, and a voltage booster circuit 214. Among address registers provided in the two-stage configuration, the address registers 204 and 206 at the rear form the current address holding portion of the present invention, and the address registers 203 and 205 at the front form the reserved address holding portion of the present invention.

Further, as shown in FIG. 3, each bank (A, B) 220 (201, 202) has a cell array 221 formed by memory cells arrayed in a matrix, a row (page) decoder 222, a block address decoder 223, a word line decoder 224, a first data latch circuit (DT1) 225 including a sense amplifier (S/A) and a data register and a second latch circuit (DT2) 226 including a data register arranged in a two-stage configuration on the data input/output side of the cell array 221, a column selector (Y-selector) 227, and a column decoder 228. Note that the data holding portion of the present invention is configured as the first data latch circuit 225 and the second data latch circuit 226.

Figure 4:
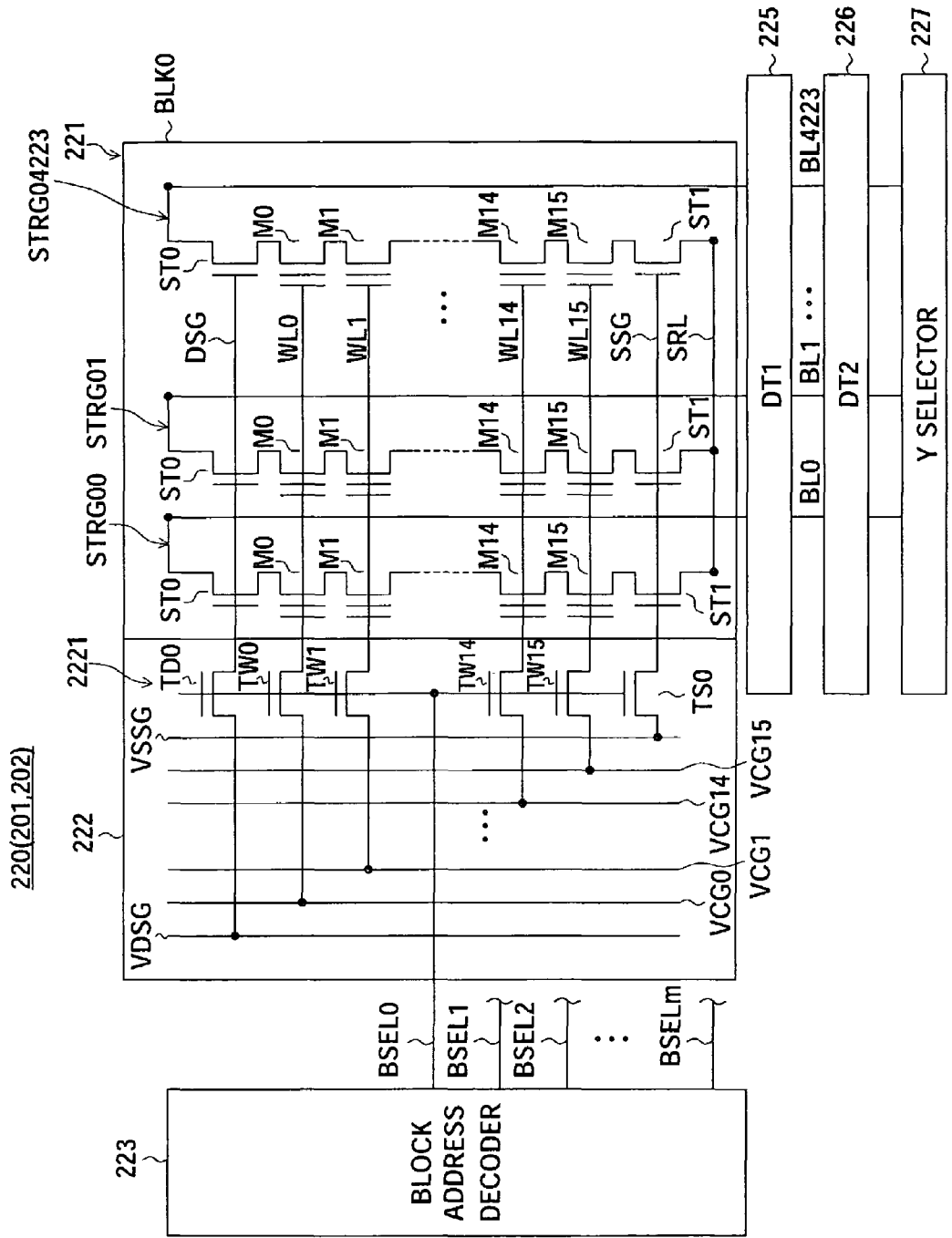
FIG. 4 is a view for explaining a specific example of the configuration of a bank and a row decoder of FIG. 3.

In the cell array 221, as shown in FIG. 4, memory strings STRG00, STRG01, and STRG04223 configured by a plurality of, for example, 16 memory transistors M0 to M15 connected in series and two selection transistors ST0 and ST1 connected in series to the two ends thereof are arranged in a matrix. Note that, in FIG. 4, for simplification of the drawing, only one block BLK0 including 4224 memory strings STRG00 to STRG04223 arranged in one row and 4224 columns is shown, but in actuality, a plurality of (m number of) blocks BLK1 to BLKm having the same configurations as that of the block BLK0 are further arrayed in each bank 220. Further, in the example of FIG. 4, the number of bit lines was made 528 bytes of which the amount for the usual 512 bytes plus a spare 16 bytes, that is, 4224 lines.

The selection transistor ST0 connected to a drain of the memory transistor M0 of the memory string STRG00 is connected to the bit line BL0, the drain of the memory transistor M0 of the memory string STRG01 is connected to the bit line BL1, and the drain of the memory transistor M0 of the memory string STRG4223 is connected to the bit line BL4223 in the same way. Further, the selection transistor ST1 to which the source of the memory transistor M15 of each of the memory strings STRG00 to 04223 is connected, is connected to a common source line SRL.

Further, the gate electrodes of the memory transistors of the memory strings STRG00 and STRG01 to STRG04223 arranged in the same row are connected to common word lines WL0 to WL15, the gate electrodes of the selection transistors ST0 are connected to the common selected gate line DSG, and the gate electrodes of the selection transistors ST1 are connected to the common selected gate line SSG.

The row decoder 222 has a transfer gate group 2221 controlled in conduction state by the block address decoder 223, and drive voltage supply lines VCG0 to VCG15, VDSG, and VSSG supplied voltages from the word line decoder 224 for supplying the voltages to the word lines and selected gate lines. Note that, in FIG. 4, a block address decoder portion and a transfer gate group corresponding to the block BLK0 are shown for the simplification of the drawing, but in actuality, the block address decoder portions and transfer gate groups are provided corresponding to a plurality of arrayed not illustrated blocks.

The transfer gate group 2221 is configured by transfer gates TW0 to TW15, TD0, and TS0. The transfer gate group 2221 is held in the conductive state by a signal BSEL which is generated in response to the block address decoded at the block address decoder 223 and drives the selected gate lines and word lines of the corresponding block. Specifically, when the block BLK0 is address designated, the transfer gates TW0 to TW15 operationally connect the word lines WL0 to WL15 and the drive voltage supply lines VCG0 to VCG15 in response to the output signal BSEL0 of the block address decoder 223, and the transfer gates TD0 and TS0 operationally connect the selected gate lines DSG and SSG and the drive voltage supply lines VDSG and VSSG in response to the output signal BSEL0 of the block address decoder 223 in the same way.

The block address decoder 223 decodes the block addresses from addresses held in the address registers 204 and 206 of the two-stage connected address registers 203 and 204 and address registers 205 and 206 in response to control signals of the bank control circuits 211 and 212 and holds the transfer gate group 2221 for driving the selected gate lines and word lines of the corresponding block of the row decoder 222 in the conductive state by the signal BSEL in response to the decoded block address.

The word line decoder 224 generates drive voltages boosted by the booster circuit 214 in accordance with the operation to the drive voltage supply lines VCG0 to VCG15, VDSG, and VSSG from addresses held in the address registers 204 and 206 in response to control signals indicating a read, write, or erase operation of the bank control circuits 211 and 212 and supplies the same to the row decoder 222.

In the bank 220 (201, 202), as explained above, the first data latch circuit 225 and the second data latch circuit 226 are arranged between the cell array 221 and the column selector 227. The first data latch circuit 225 and the second data latch circuit 226 are controlled in their data holding and data transfer operations by the bank control circuits 211 and 212 provided corresponding to each bank. Specifically, a read operation of data from the cell array 221 is executed by using the front first data latch circuit 225 at the time of a read operation. The data finished being read is once input to the first data latch circuit 225 of the front stage and held there. Soon thereafter (at a predetermined timing), the data is transferred to the rear second data latch circuit 226 and held under the control of the bank control circuits 211 and 212. Data is output and transferred to the outside (controller 3) as follows: When data is held in the second data latch circuit 226, the bank control circuits 211 and 212 transfer ready signals indicating that the read data of their banks can be transferred to the controller 3. When receiving a command issued by the controller 3 in response instructing them to transfer data to the outside, the bank control circuits 211 and 212 issue instructions (control signals) by which the second data latch circuit 226 transfers data to the outside through the column selector 227 selectively controlled by the column decoder 228 and through the bank switching route (multiplexer/demultiplexer) of the data input/output portion 208 of FIG. 2. Accordingly, during the transfer period of the held data of this second data latch circuit 226, control is performed so that the next read operation from the cell array 221 is executed using the front first data latch circuit 225.

Further, at the time of a data write operation, the second data latch circuit 226 functions as the front latch circuit and the first data latch circuit 225 functions as the rear latch circuit. The data of the second data latch circuit 226 is transferred to the rear first data latch circuit 225. The data held there is written into the cell array 221. The column control circuits 211 and 212 control the data write operations of their own columns so as to enable continuous latching of the next data in the second data latch circuit 226 during that period.

Figure 5:
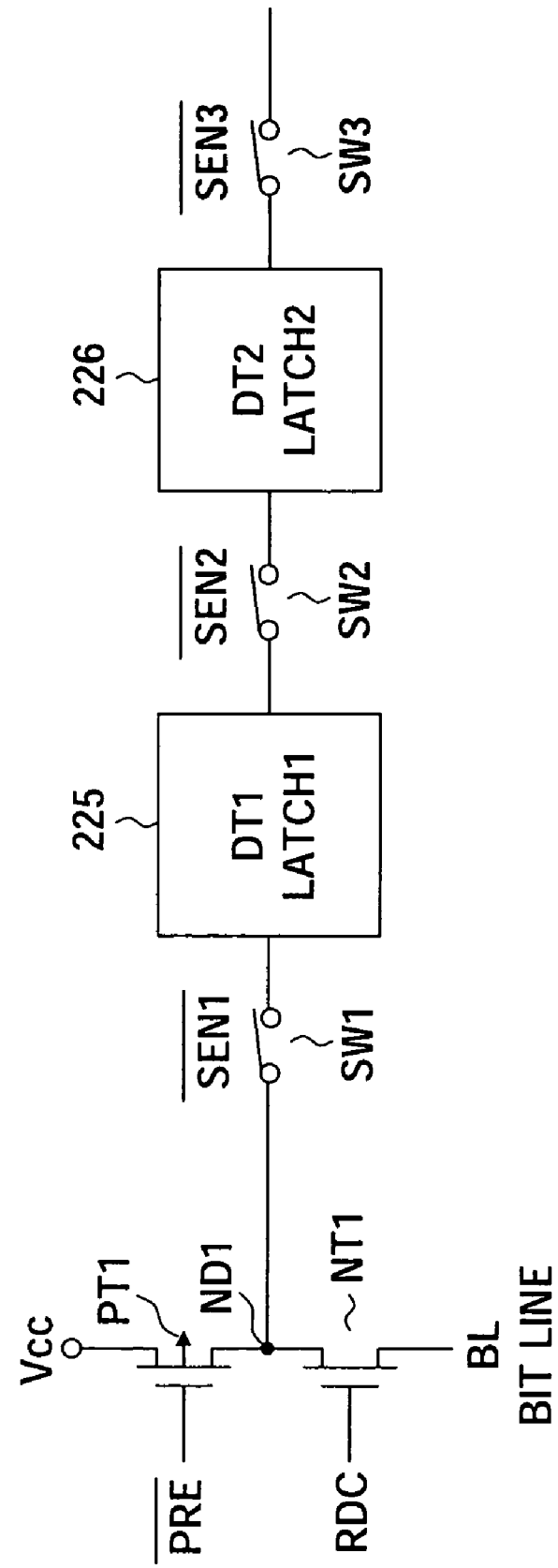
FIG. 5 is a view of an example of the configuration of a data transfer route between a bit line of a cell array and a column selector in a bank.

FIG. 5 is a view of an example of the configuration of a data transfer route between a bit line and the column selector 227 of the cell array 221 in a bank. In each bank 220 (201, 202), as shown in FIG. 5, switches SW1, SW2, and SW3 configured by MOS transistors etc. turned on/off by control signals are arranged between each bit line BL (0 to 4223) and the first data latch circuit (DT1) 225, between the first data latch circuit 225 and the second data latch circuit 226, and between the second data latch circuit 226 and the column selector 227. By the column control circuits 211 and 212 turning these switches SW1, SW2, and SW3 on/off at predetermined timings, data is transferred at the time of a read operation and the time of a write operation as explained above.

In the circuit of FIG. 5, the source and drain of an n-channel MOS transistor (NMOS) NT1 are connected between a bit line BL and the switch SW1, the drain and source of a p-channel MOS (PMOS) transistor PT1 are connected between a connection node ND1 thereof and the power supply potential Vcc, a high level active signal RDC is supplied to the gate of the NMOS transistor NT1, and a low level active signal /PRE (/ indicates the inversion of the level) is supplied to the gate of the PMOS transistor PT1. Further, the switches SW1 to SW3 are configured by for example PMOS transistors and turned on/off by low level active signals /SEN1 to /SEN3 supplied at predetermined timings.

Figure 6:
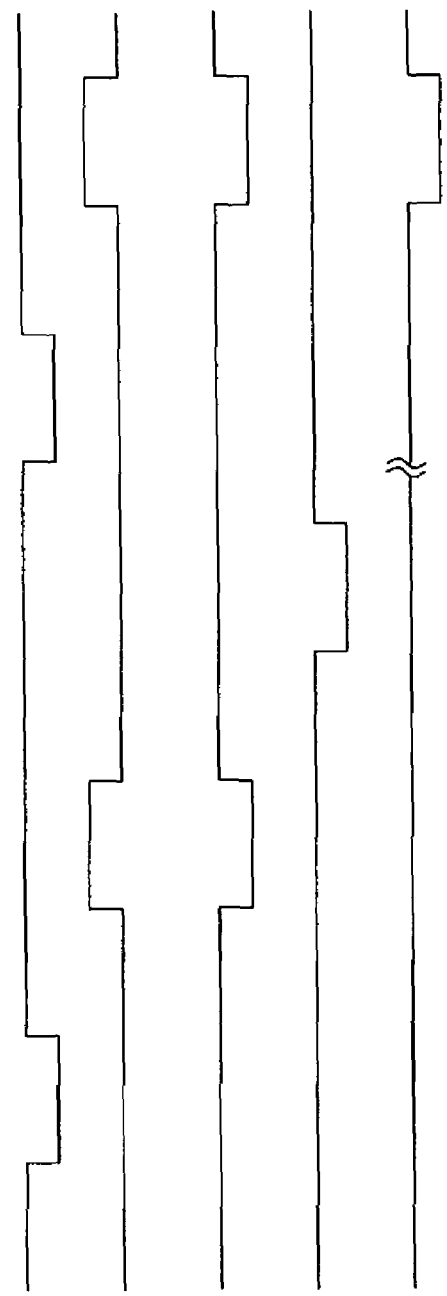
FIGS. 6A to 6E are timing charts of a circuit of FIG. 5 at the time of a read operation.

FIGS. 6A to 6D are timing charts of the circuit of FIG. 5 at the time of a read operation. In the circuit of FIG. 5, at the time of a data read operation, first, as shown in FIG. 6A, a precharge signal /PRE is supplied to the gate of the PMOS transistor PT1 at a low level for a predetermined period. As a result, the PMOS transistor PT1 becomes the conductive state, and the node ND1 is precharged to the power supply potential Vcc. Then, as shown in FIGS. 6B and 6C, a read control signal RDC is supplied to the gate of the NMOS transistor NT1 at a high level for a predetermined period, and the first switch control signal /SEN1 is supplied to the switch SW1 at the active low level for a predetermined period. Due to this, the NMOS transistor NT1 becomes the conductive state, then the switch SW1 becomes the ON state, and the read data of the bit line BL is transferred to the first data latch circuit 225. Thereafter, the read control signal RDC is switched to the low level, the first switch control signal /SEN1 is switched to the high level, and the NMOS transistor NT1 and the switch SW1 become off. In this way, after the read data is transferred to the first data latch circuit 225, as shown in FIG. 6D, the second switch control signal /SEN2 is supplied to the switch SW2 at the low level for a predetermined period. Due to this, the switch SW2 becomes on, and the read data held in the first data latch circuit 225 is transferred to the second data latch circuit 226.

Then, as explained above, when the data is held in the second data latch circuit 226, the bank control circuits 211 and 212 transfer ready signals indicating that the read data of their banks can be transferred to the controller 3. When receiving an outside transfer command issued by the controller 3 in response thereof, as shown in FIG. 6E, a third switch control signal /SEN3 is supplied to the switch SW3 of the low level for a predetermined period and transferred to the controller 3 through the bank switching route (multiplexer/demultiplexer) of the data input/output portion 208 of FIG. 2 through the column selector 227 selectively controlled by the column decoder 228 from the second data latch circuit 226. During the transfer of the held data of this second data latch circuit 226, as shown in FIG. 6A, the precharge signal /PRE is supplied to the gate of the PMOS transistor PT1 at the low level for a predetermined period. As a result, the PMOS transistor PT1 becomes the conductive state, and the node ND1 is precharged to the power supply potential Vcc. Then, as shown in FIGS. 6B and 6C, the read control signal RDC is supplied to the gate of the NMOS transistor NT1 at the high level for a predetermined period, and the first switch control signal /SEN1 is supplied to the switch SW1 at the active low level for a predetermined period. Namely, during the period where the data is transferred from the second data latch circuit 226 to the outside, the control is carried out so that the next read operation is executed from the cell array 221 by using the front first data latch circuit 225.

Figure 7:
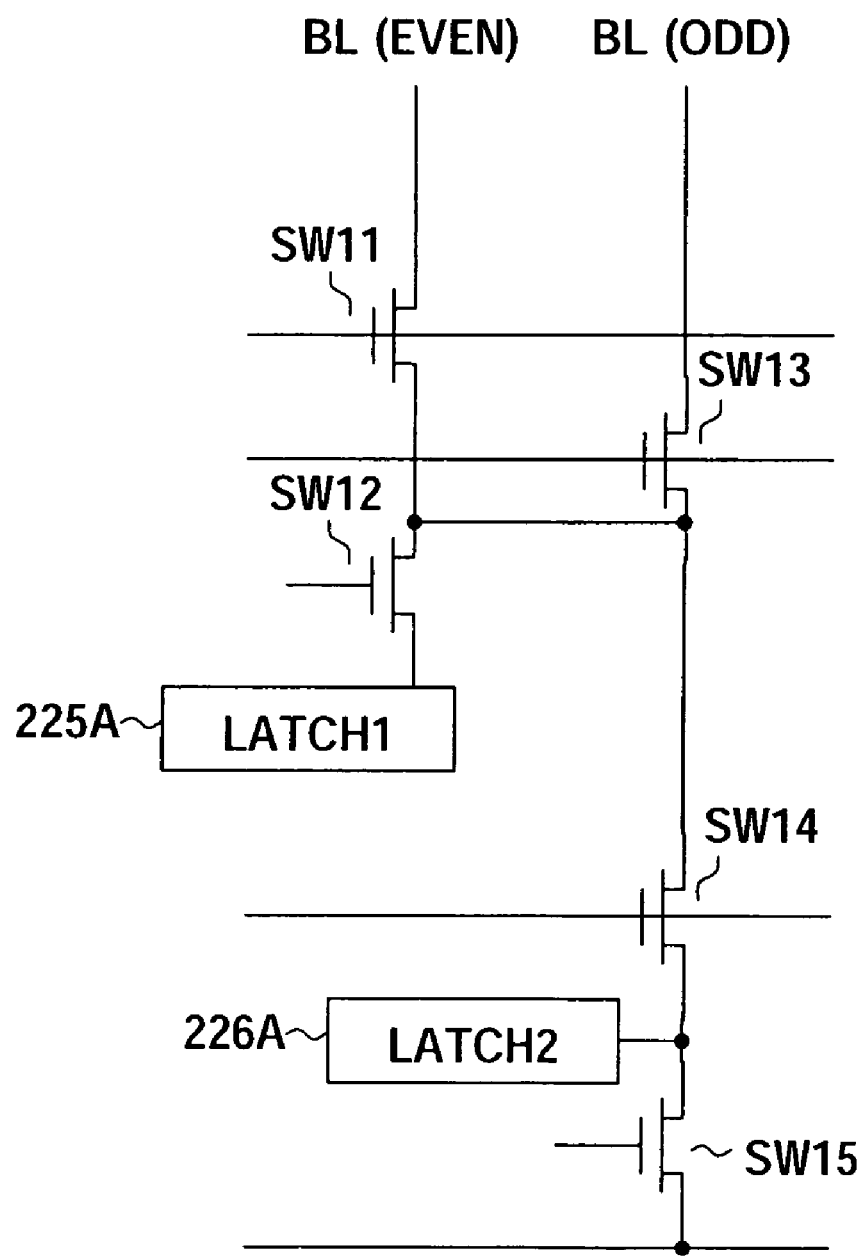
FIG. 7 is a view of another example of the configuration of a data transfer route between a bit line of a cell array and a column selector in a bank.

FIG. 7 is a view of another example of the configuration of the data transfer route between a bit line and the column selector 227 of the cell array 221 in a bank. Compared with the example of FIG. 5 where a latch circuit is provided for each bit line, the data transfer route system of FIG. 7 is configured so as to share two types of latches for each bit line.

A first data latch circuit 225A includes a sense amplifier S/A, and a second data latch circuit 226A functions as a write buffer and a read buffer. Switches SW11 and SW12 configured by MOS transistors are connected in series between the first data latch circuit 225A and first ends of even number bit lines BL0, BL2, . . . , switches SW13 and SW14 configured by MOS transistors are connected in series between the second data latch circuit 226A and first ends of odd number bit lines BL1, BL3, . . . , and the connection point of the even number column switch SW11 and switch SW12 and the connection point of the odd number column switch SW13 and switch SW14 are directly connected. The switch SW15 is arranged between the connection point of the switch SW14 and the input/output terminal of the second data latch circuit 226A and the transfer line on the column selector 227 side.

In the circuit of FIG. 7, for example the data of an even number column is read by turning on the switches SW11 and SW12, transferring the data to the first data latch circuit 225A for holding, turning off the switch SW11, setting the switches SW12 and SW14 to the on state, and transferring the data from the first data latch circuit 225A to the second latch circuit 226A. Then, control is performed to turn the switch SW14 off, turn the switches SW13 and SW12 on, and turn the switch SW15 on to transfer the data of the odd number column to the first data latch circuit 225A for holding and transfer (output) the read data of the even number column previously transferred to the second latch circuit 226A to the column selector 227 side. By performing the control as described above, the number of data latch circuits can be decreased, and it becomes possible to minimize the time lag at the time of the page switching.

In a bank 220 having such a configuration, for example a read operation of the data of the memory transistor M14 of the memory string STRG00 (to TRG04223) of the block BLK0 of the first row, and a write operation of the data into the memory transistor M14 are carried out as follows.

Figure 8:
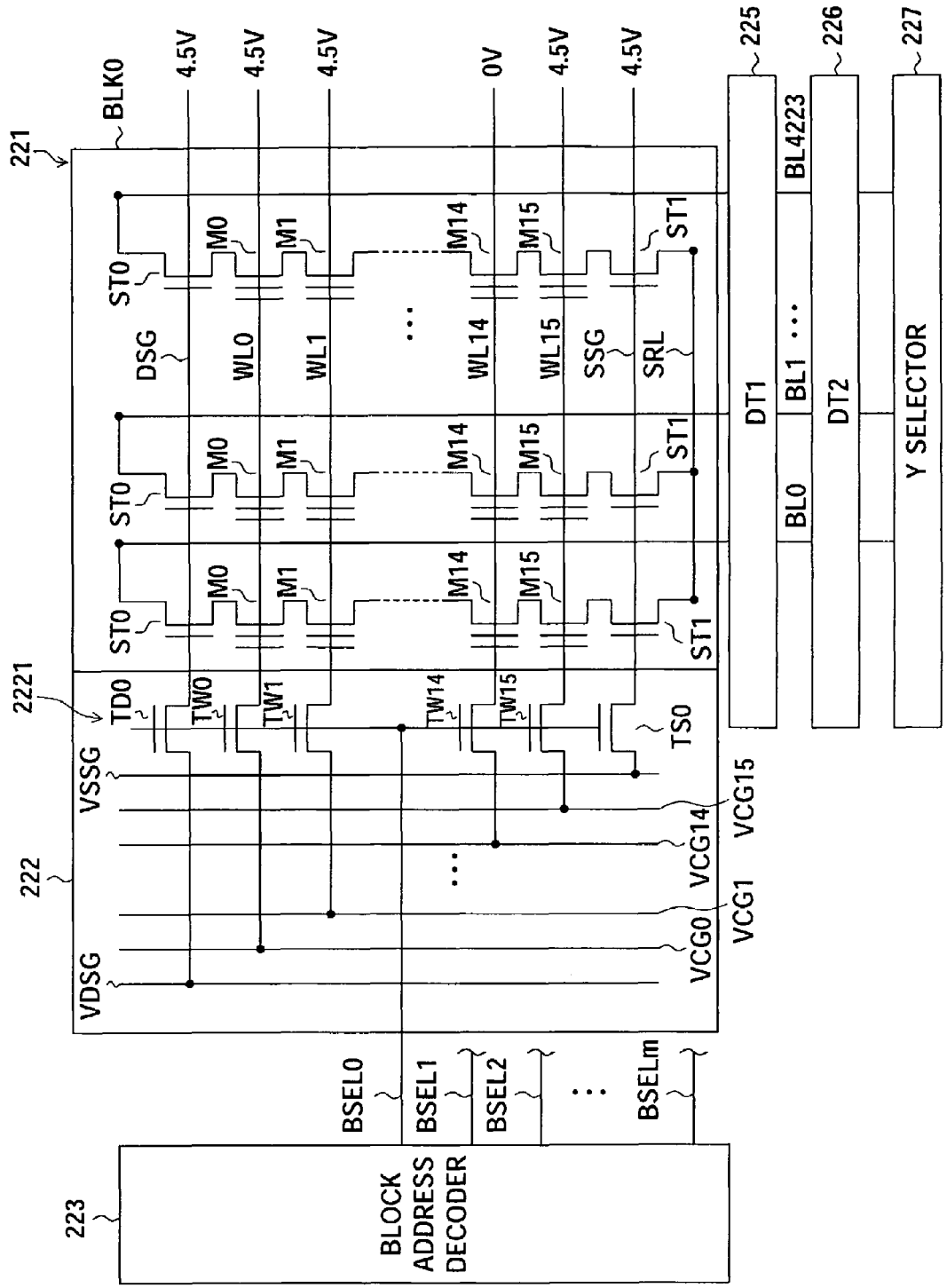
FIG. 8 is a diagram showing the bias condition of each drive line at the time of a data read operation in the bank of FIG. 2.

At the time of a read operation, as shown in FIG. 8, a ground voltage GND (0V) is supplied to the drive voltage supply line VCG14 by the word line decoder 224, for example 4.5V is supplied to the drive voltage supply lines VCG0 to VCG13 and VCG15 and the drive voltage supply lines VDSG and VSSG, and the ground voltage 0V is supplied to the source line SRL. Then, in the block address decoder 223, the active address signal is input to only a portion corresponding to the block BLK0, the output signal BSEL0 of the block address decoder 223 is output at a level of 4.5V+α, and the output signals BSEL1 to BSELm of the block address decoder corresponding to the other blocks BLK1 to BLKm are held at the ground potential GND level. Due to this, the transfer gates TW0 to TW15, TD0 and TS0 of the transfer gate group 2221 corresponding to the block BLK0 become the conductive state, and the transfer gates of the transfer gate group corresponding to the other blocks BLK1 to BLKm are held in the non-conductive state. As a result, the selection transistors ST0 and ST1 of the memory string STRG00 become the conductive state, and the data is read out to the bit line BL0.

Figure 9:
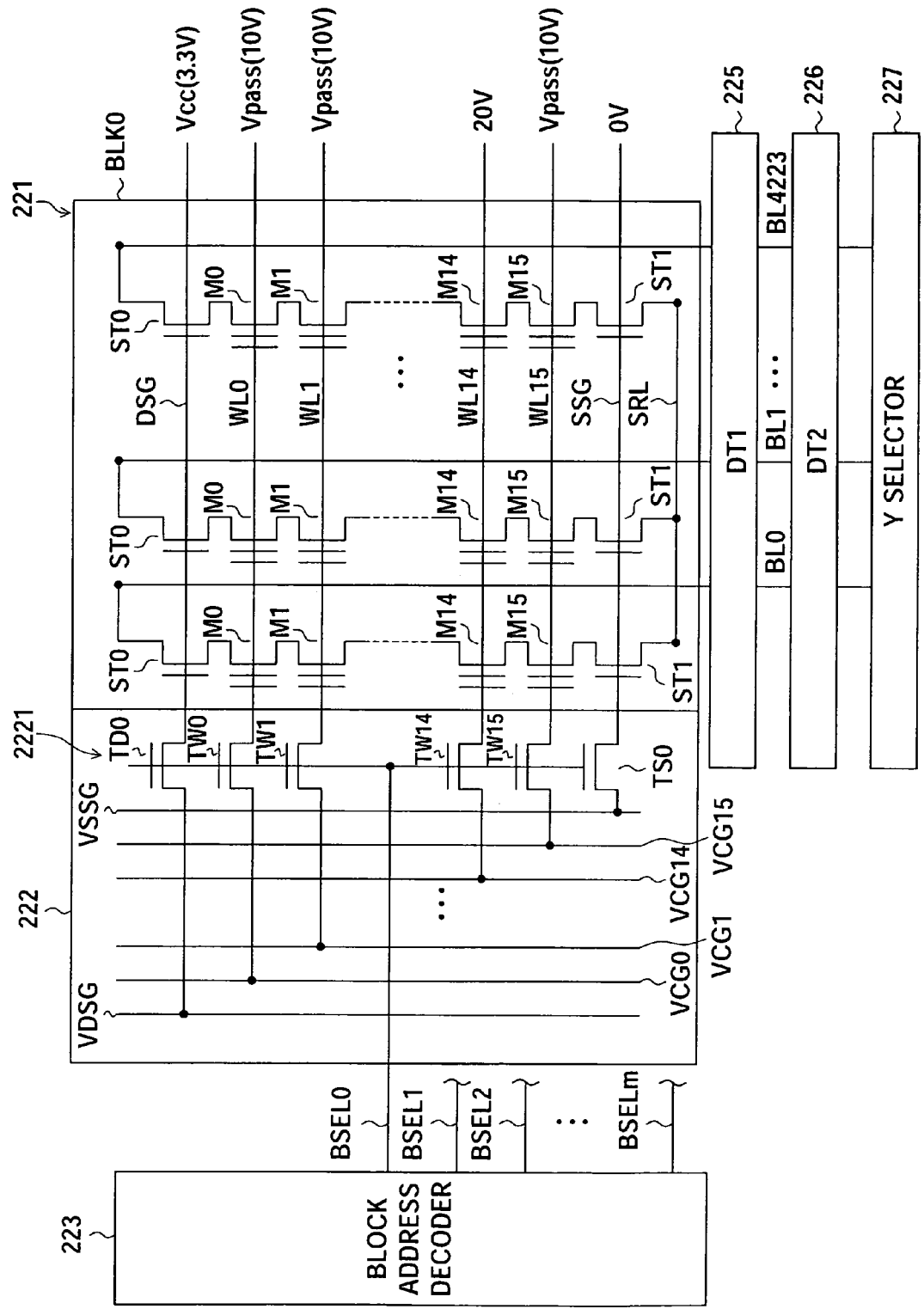
FIG. 9 is a diagram showing the bias condition of each drive line at the time of a data write operation in the bank of FIG. 2.

At the time of a write operation, as shown in FIG. 9, a high voltage, for example 20V, is supplied to the drive voltage supply line VCG14 selected by the word line decoder 224, an intermediate voltage (for example 10V) is supplied to the drive voltage supply lines VCG0 to VCG13 and VCG15, the power supply voltage Vcc (for example 3.3V) is supplied to the drive voltage supply line VDSG and the ground potential GND (0V) is supplied to the drive voltage supply line VSSG. Further, the ground voltage GND is supplied to the bit line BL0 to which the memory string STRG00 having the memory transistor M14 for which the writing is to be carried out is connected, and the power supply voltage Vcc is supplied to the bit lines BL1 to BL4223 to which memory strings STRG01 to STRG04223 having memory transistors M14 for which the writing is to be prohibited are connected. Then, the output signal BSEL0 of the block address decoder 223 is output to only the portion corresponding to the block BLK0 of the row decoder 222 at the level of 20V+α, and the output signals BSEL1 to BSELm of the block address decoder corresponding to the other blocks BLK1 to BLKm are output at the ground voltage GND level. Due to this, the transfer gates TW0 to TW15, TD0, and TS0 of the transfer gate group 2221 corresponding to the block BLK0 become the conductive state, and the transfer gates of the transfer gate groups corresponding to the other blocks BLK1 to BLKm are held in the non-conductive state. As a result, the write voltage 20V is supplied to the selected word line WL14, and pass voltages (intermediate voltages) Vpass (for example 10V) are applied to the unselected word lines WL0 to WL13, and WL15.

Due to this, the selection transistors ST0 of the memory strings STRG01 to STRG04223 become cut off, and the channel portions of the memory strings STRG01 to STRG04223 to which the memory transistors for which the writing is to be prohibited are connected enter a floating state. As a result, potentials of these channel portions are boosted by capacitor coupling with the pass voltage Vpass mainly supplied to the unselected word lines and rise up to the write prohibit voltage, whereby writing of data into the memory transistors M14 of the memory strings STRG01 to STRG04223 is prohibited. On the other hand, the channel portion of the memory string STRG00 to which the memory transistor to be written with the data is connected is set at the ground potential GND (0V), the data is written into the memory transistor M14 by the potential difference between this and the write voltage 20V supplied to the selected word line WL14, and the threshold voltage shifts to the positive direction and becomes for example about 2V from −3V of the erase state.

As in the above operation, in the NAND type flash memory 2 of the present embodiment, in accordance with the address held in the address register 204 or address register 206 of the address registers connected in two stages, the data is read in units of rows (pages) from the cell array 221 of the corresponding bank 201 or 202.

Namely, one set of address registers 203 and 204 and one set of address registers 205 and 206 are arranged correspondingly to the banks 201 and 202. The address values from the external controller 3 input through the control system signal input/output portion 207 are first held in the front address registers 203 and 205, then transferred and stored in the latter address registers 204 and 206. These are decoded and used for reading the cell array. Namely, the flash memory 2 of the present embodiment is configured so as to be able to receive in advance and hold the address for the next read operation from the outside in addition to the address for the current read operation. Note that, also at the time of the write operation, the addresses transferred and stored in the address registers 204 and 206 are decoded and used for the write operation of the cell array. Note that further, in the present embodiment, an explanation will be given of the read processing, while a specific explanation of the write processing will be omitted.

The control system signal input/output portion 207, as shown in FIG. 2, has an output portion 2071 of the ready (RY)/busy (BY) signal on the bank (A) (201) side, an output portion 2072 of the ready (RY)/busy (BY) signal on the bank (B) 202 side, a command/address control (CMD/ADR) unit 2073 for input of commands/addresses, and an operation logic control unit 2074 for input of control signals.

In the flash memory 2 of the present embodiment, there are a plurality of (two as an example) banks 201 and 202. Output pins (terminals) P2071 and P2072 of the ready (RY)/busy (BY) signals are connected to the output portions 2071 and 2072 one-to-one assigned to the banks 201 and 202. The RY/BY pins P2071 and P2072 corresponding to the banks 201 and 202 reflect the states of progress of the commands requested to the banks of themselves and indicate to the external controller 3 the states of the banks themselves as ready or busy. For example, "ready" is defined as the high potential (power supply potential Vcc), and "busy" is defined as the low potential (ground potential). Especially, in the read operation, the flash memory 2 of the present embodiment makes the RY/BY pins P2071 and P2072 the high level and transfers the ready signal RY to the external controller 3 when the preparation of the data requested to be read is completed and the transfer command for outputting the data can be received. In the read operation, during the period where the preparation of the data requested to be read is not completed and the state where a transfer command for outputting the data can be received is not exhibited, the RY/BY pins P2071 and P2072 are made the low level, and the busy signal BY is transferred to the external controller 3.

The command/address control (CMD/ADR) unit 2073 for input of commands/addresses receives as input commands such as a read command RD or a write command WR and addresses to be read or written, outputs the commands to the command register 209 and the control circuit 210, and supplies the addresses to the address registers 203 and 205 and the control circuit 210. The command/address control unit 2073 has connected to it a plurality of input pins PCA2073 for input of the commands CMD and addresses transferred from the controller 3. In this way, the command/address control unit 2073 only has input pins connected to it.

The operation logic control unit 2074 for input of the control signals supplies control system signals such as a chip enable signal /CE, a read enable signal /RD, or a write enable signal /WE to the control circuit 210 and the command/address control unit 2073. The operation logic control unit 2074 has a plurality of input pins PL2074 for inputting the control system signals transferred from the controller 3 connected to it. In this way, the operation logic control unit 2074 only has input pins connected to it.

The control system signal input/output portion 207 of the present embodiment does not have a system for input/output of data. For the only output system as well, there are only the output pins (terminals) P2071 and P2072 of the 1-bit ready (RY)/busy (BY) signal.

The data input/output portion 208 has a multiplexer (MPX)/demultiplexer (DeMPX) 2081 and an input/output (I/O) buffer 2082. The I/O buffer 2082 has a plurality of data pins PD2082 for outputting the read data to the controller 3 and receiving as input the write data from the controller 3 connected to it. A plurality of data pins PD2082 are connected with the controller 3 to data lines shared by a plurality of banks, i.e., in the present embodiment, the bank (A) 201 and the bank (B) 202. At the time of a read operation, the multiplexer/demultiplexer 2081 switches the read data transferred through the column selector 227 from the second data latch circuit 226 of the bank (A) 201 and the read data transferred through the column selector 227 from the second data latch circuit 226 of the bank (B) 202 at a predetermined timing under the control of for example the control circuit 210 or the column control circuits 211 and 212 and selectively inputs the same to the I/O buffer 2082.

In this way, in the interface (I/F) with the controller 3, that is, the control system signal input/output portion 207 and the data input/output portion 208, the lines are divided to the data lines and other signal lines (command/addresses and signals of the control system etc.). Due to this, even during data transmission/reception, the transfer etc. of the next command/address become possible. Further, it also becomes possible to employ an I/F having a high speed physical characteristic for only the data lines.

The command register 209 holds the command supplied by the command/address control unit 2073 and supplies the same to the control circuit 210.

The control circuit 210 decodes the control signal supplied from the operation logic control unit 2073 and the command supplied from the command register 209 and performs the processing for enabling the entire flash memory 2 etc., judges which of the bank (A) 201 or the bank (B) 202 the access (for example read) is instructed by the command made, and instructs the same to the corresponding bank control circuit 211 or 212. Further, the control circuit 210 instructs the voltage to be boosted to the booster circuit 214 in accordance with the command, specifically, as explained above, so that a voltage in accordance with the command is obtained since the voltage supplied to the drive line is different between the time of a read operation and the time of a write operation.

The bank control circuit 211 performs the predetermined control of the block address decoder 223, the word line decoder 224, and the column decoder 228 of the bank (A) 201, and the control of the timing of the data transfer of the first data latch circuit 225 and the second data latch circuit 226 when it is informed by the control circuit 210 that the command is for example the read to the bank 201. Further, the bank control circuit 211 generates a ready (RY)/busy (BY) signal reflecting the state of progress of a command of the bank 201 and notifies the same to the external controller 3.

The bank control circuit 212 performs the predetermined control of the block address decoder 223, the word line decoder 224, and the column decoder 228 of the bank (B) 202 and the control of the timing of the data transfer of the first data latch circuit 225 and the second data latch circuit 226 when it is informed by the control circuit 210 that the command is for example a read operation to the bank 202. Further, the bank control circuit 212 generates the ready (RY)/busy (BY) signal reflecting the state of progress of a command of the bank 202 and notifies the same to the external controller 3.

In this way, inside the flash memory 2 of the present, embodiment, there are control circuits 210, 211, and 212 for controlling the banks 201 and 202. Under the control of the control circuits 210, 211, and 212, it is possible to decode a command and bank address, a block address, and a page address designated from the external controller 3 and operate the banks simultaneously in parallel. Further, it is possible to generate a ready (RY)/busy (BY) signal reflecting the states of progress of commands of the banks 201 and 202 and notify the same to the outside.

Further, the bank control circuits 211 and 212 store the information comprehensively reflecting the states of operation of the banks 201 and 202 in the status register 213. For example, when the controller 3 accesses this status register 213, the situation of the entire chip of the flash memory 2 may be grasped.

The booster circuit 214 boosts the power supply voltage Vcc in response to a command of a read operation etc. according to the instruction of the control circuit 210 and supplies the result to the row decoder 222 and the word line decoder 224 etc. of the bank 201 and 202. For example, at the time of a read operation, as explained above, a voltage of 4.5V is necessary, so the voltage is boosted from 3.3V to 4.5V. Further, at the time of a write operation, as explained above, 20V and the intermediate voltage 10V are necessary, so the voltage is boosted to 20V and 10V.

Figure 10:
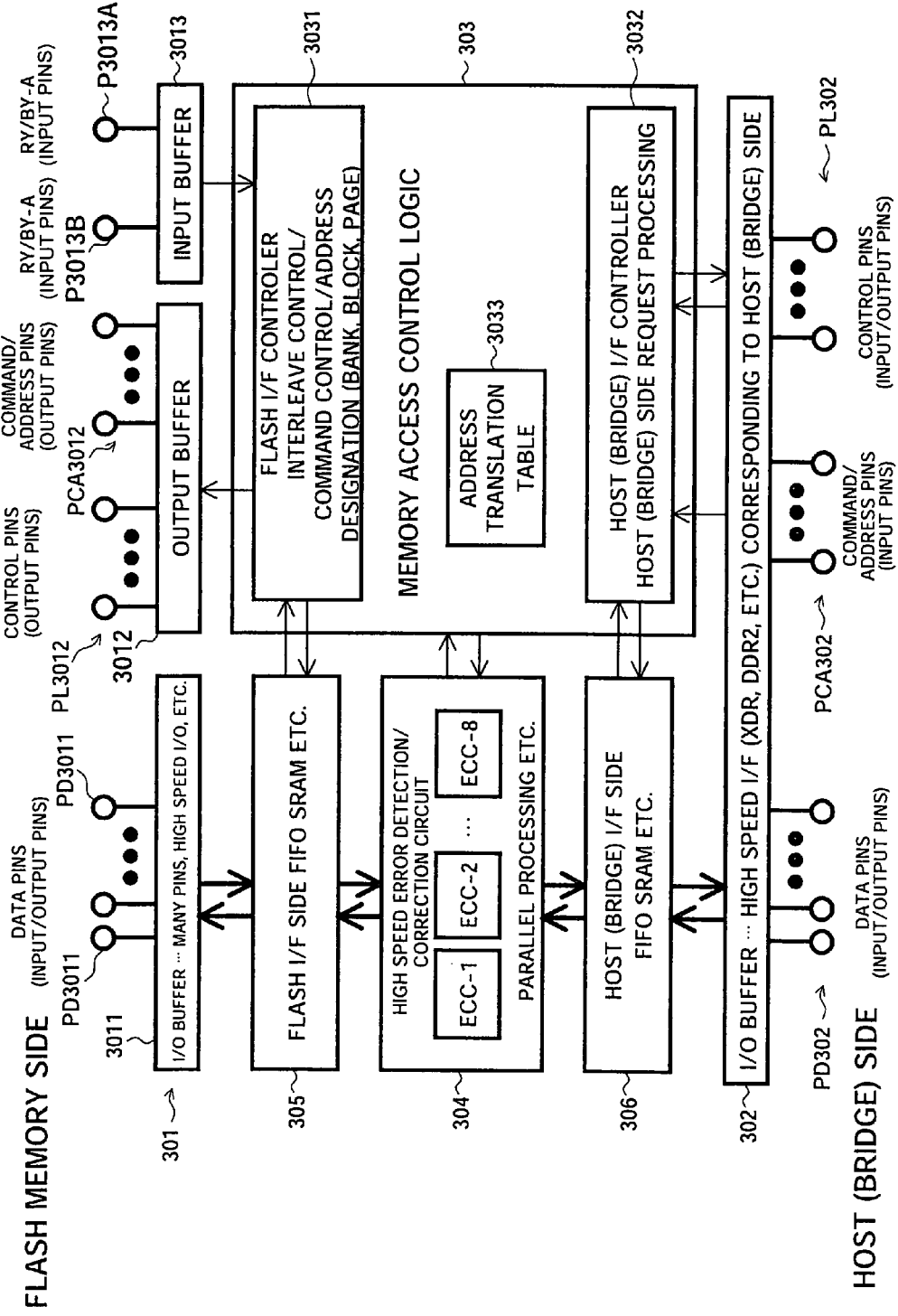
FIG. 10 is a block diagram of a specific example of the configuration of a controller according to the present embodiment.

Next, an explanation will be given focusing on the more specific configuration and function of the controller 3. FIG. 10 is a block diagram of a specific example of the configuration of the controller 3 according to the present embodiment.

The controller 3 has an I/F portion 301 designed based on the communication protocol on the flash memory 2 side, an I/F portion 302 designed based on the communication protocol on the host (bridge) side, a memory access control circuit 303, an error detection/correction circuit 304, a flash I/F side FIFO 305, and a host (bridge) side FIFO 306 as principal components.

The flash side I/F portion 301 has an I/O buffer 3011 for inputting and outputting the data, an output buffer 3012 for outputting a control signal and a command/address to the flash memory 2, and an input buffer 3013 for receiving as input a ready (RY)/busy (BY) signal from the flash memory 2.

The I/O buffer 3011 has a plurality of data pins PD3011 for receiving as input the read data transferred from the flash memory 2 and outputting the write data from the controller 3 connected to it. The plurality of data pins PD3011 are connected to a plurality of data pins PD2082 of the data input/output portion 208 of the flash memory 2 via the data lines shared by the bank (A) 201 and the bank (B) 202. The I/O buffer 3011 transfers data with the flash I/F side FIFO 3035 inside the controller 3.

The output buffer 3012 outputs the control signal and command/address from the memory access control circuit 303 and has a plurality of control pins PL3012 and command/address pins PCA3012 for outputting these control signals and command/address connected to it. A plurality of control pins PL3012 are connected to a plurality of control pins PL2074 of the operation logic control unit 2074 in the control system signal input/output portion 207 of the flash memory 2. Further, a plurality of command/address pins PCA3012 are connected to the command/address pins PCA2073 of the command/address logic control unit 2073 in the control system signal input/output portion 207 of the flash memory 2.

The input buffer 3013 inputs the ready (RY)/busy (BY) signal of the flash memory 2 to the memory access control circuit 303. The input buffer 3013 has ready (RY)/busy (BY)

signal input pins (terminals) P3013A and P3013B connected to it. These ready (RY)/busy (BY) signal input pins (terminals) P3013A and P3013B are connected to the ready (RY)/busy (BY) signal output pins (terminals) P2071 and P2072 of the output portions 2071 and 2072 in the control system signal input/output portion 207 of the flash memory 2.

The I/O buffer 302 includes a high speed I/F corresponding to the CPU side, that is, the host (bridge) side, a plurality of data input/output pins PD302 for data input/output with the bridge circuit 5, an input pin PCA302 for input of the command/address, and an input/output pin PL302 for input and output of the control signal connected to it.

The memory access control circuit 303 has a flash I/F side controller 3031 which performs interleave control, command control, and address designation (bank, block, page), outputs a control signal, command, and address to the flash memory 2 by the output buffer 3012, and controls the data input/output of the flash I/F side FIFO 305, a host I/F side controller 3032 which performs request processing with the host side and controls the data input/output of the host I/F side FIFO 306, and an address translation table 3033 for performing the address translation processing (mapping processing, logical/physical address translation processing translating a logical address designated by the host to a physical address on the flash memory).

The error detection/correction circuit 304 performs the error detection and/or correction processing with respect to the read data from the flash memory 2, and the addition of the error correction code with respect to the write data to the flash memory 2.

The flash I/F side FIFO 305 and the host (bridge) I/F side FIFO 306 are arranged in each of the flash memory side I/F and the host (bridge) side I/F in order to secure the match of the timing of the data flow. The flash I/F side FIFO 305 and the host (bridge) I/F side FIFO 306 are configured by for example static random access memories (SRAMs).

Here, an explanation will be given of the sequence of a read operation of the flash memory 2 according to the present embodiment with reference to FIGS. 11A to 11L. Note that, here, an explanation will be given of the operation sequence between the controller 3 and the flash memory 2.

<Read Operation Sequence of Flash Memory>

As shown in FIG. 11A, the command for an internal read operation of the bank (A) 201 at the address 0 is issued from the controller 3 through the pin PL3012 of the control system. This address value is stored in the address register (A-AD2) 204 through the input pin PCA2073 and address register (A-AD1) 203 as shown in FIGS. 11E and 11F. The address value stored in the address register (A-AD2) 204 is decoded, then the internal read operation of the address 0 of the cell array 221 of the bank (A) 201 is commenced. In parallel with this, as shown in FIG. 1C, the RY/BY-A signal is changed to the busy state by the bank controller 211.

This "busy" indicates the state where the preparations for transferring the data 0 stored at the cell array of the bank (A) 201 at the address 0 to the outside have not yet been completed. Here, as shown in FIG. 11A, even when an internal read operation of the bank (A) described above is in progress, a command for reserving the bank (A) and address 2 as the location of the next internal read operation may be issued from the controller 3. When this is issued, as shown in FIG. 1E, the address value thereof is stored for the time being in the address register (A-AD1) 203. Here, since internal read operations of the bank (A) 201 and the bank (B) 202 may be performed simultaneously in parallel, a command for the internal read operation of the bank (B) 202 at the address 1 is further subsequently issued. An interleave operation between different banks is possible.

This address value passes through the address register (B-AD1) 205 and is stored in the address register (B-AD2) 206 as shown in FIGS. 11I and 11J. The address value stored in the address register (B-AD2) 206 is decoded, then the internal read operation of the commenced. In parallel with this, as shown in FIG. 1D, the RY/BY-B signal is changed to the busy state by the bank controller 212. This "Busy" indicates the state where the preparations for transferring the data 1 stored in the cell array of the bank (B) at the address 1 have not yet been completed. Here, in the same way as the above, even when an internal read operation of the bank (B) 202 is in progress, as shown in FIG. 11A, a command for reserving the bank (B) 202 and address 3 as the location of the next internal read operation may be issued from the controller 3. When this is issued, the address value thereof is stored for a while in the address register (B-AD1) 205.

The internal read operation of the bank (A) 201 and address 0 ends by the storage of the data (data 0 this time) in the first data latch circuit (A-DT1) 225 as shown in FIG. 11G when the data is established by the operation of the sense amplifier (S/A).

Thereafter, the data stored in the first data latch circuit (A-DT1) 225 is transferred to the second data latch circuit (A-DT2) 226 as shown in FIGS. 11G and 11H. Then, as shown in FIG. 1C, the RY/BY-A signal is changed to the ready state by the bank controller 211. This "Ready" shows that the preparations for transferring the data to the outside have been completed by the storage of the data 0 which was stored in the cell array of the bank (A) 201 at the address 0 in the second data latch circuit (A-DT2) 226.

In parallel with this, the address value, that is, the address 2 (value reserved for the next read operation of the bank A), stored in the address register (A-AD1) 203 is transferred to the address register (A-AD2) 204, this value is decoded, and the internal read operation of the address 2 of the cell array 221 of the bank (A) 201 is commenced again. An interleave operation inside the same bank is possible.

Further, the controller 3 receives the RY/BY-A signal indicating the ready state and issues a command for the transfer of the data in the bank (A) 201 at the second data latch circuit (A-DT2) 226 to the outside.

Upon receiving this command, the flash memory 2 transfers the stored data, that is, the data 0, of the bank (A) 201 at the second data latch circuit (A-DT2) 226 through the bank switching route and the data lines to the controller 3 after a constant short delay time (latency).

Even during transfer of data through the data lines, the address register (A-AD1) 203 is in the "empty" state and the pins of the control system are in the "empty" state, therefore, as shown in FIG. 11A, a command for reserving the bank (A)201 and address 4 as the location of the next internal read operation may be issued to the flash memory 2 from the controller 3.

Further, when the internal read operation of the bank (B) 202 and address 1 operating during this finishes (the data 1 is established and stored in the data register (E-DT1) 205), an internal operation similar to the case of the bank (A) 201 and access from the controller 3 are performed for the bank (B) 202.

Below, in the same way as the above, the data stored in the cell array may be continuously fetched to the outside without interruption by combining the interleave operation between banks and the interleave operation in each bank.

FIG. 12A shows a transfer sequence of the flash memory of the present embodiment provided with two address registers, while FIG. 12B is a diagram showing the transfer sequence of a flash memory provided with only one address register.

In a flash memory provided with only one address register, the sequence is for the host side to receive and judge the ready signal, then issue an address and for the flash memory to perform an internal read operation in response to that. Therefore, in other words, a user command accompanied with an address input is used as an event for the start of the internal operation, so the cycle of the host side judgment, the latency, and the transmission of the command forces an increase in the time of the transfer cycle. Contrary to this, the flash memory of the present embodiment has the function of starting the internal operation by fetching address data from the address reservation registers 203 and 205 using an internal signal as an event. Therefore, as shown in FIG. 12A, the data stored in the cell array can be fetched to the outside continuously without interruption.

Further, to end a series of internal read/external transfer operations, the following methods can be employed.

Input end code or end command in place of input of address of the next read reservation;

If not inputting address of next read reservation, automatically end operation after the data is transferred to the outside; and Even if address of the next read reservation is set, forcibly return the status to initial state by inputting reset command etc.

As explained above, according to the present embodiment, since provision is made, corresponding to the plurality of banks 201 and 202, of the current address registers 204 and 206 for holding the addresses for reading the data of the cell arrays, the reserved address registers 203 and 205 receiving in advance and able to hold the reserved addresses for the next read operations from the outside, and the bank control circuits 211 and 212 for making the current address registers 204 to 206 hold the reserved addresses held in the reserved address registers 203 and 205, perform the reading of the data, and making the data latch circuits hold the data when the data which was read out from the cell arrays of the banks by the addresses held in the current address registers 204 and 206 and held in the data latch circuits become able to be transferred to the outside, the following effects may be obtained.

By providing a plurality of banks, it becomes possible to make the random access time of read operation appear nonexistent and thereby perform high speed read operations. By controlling the RY/BY signal for each bank, it becomes possible to control the banks in parallel. Further, by providing a plurality of address registers for each bank, it is possible to fetch in advance the address which will become necessary for the next read operation. Further, by providing a plurality of data latches, it becomes possible to fetch data corresponding to the next address during a current read operation. Further, by separating the read commands and the read data output commands, it becomes possible to issue the commands to a plurality of banks.

Further, the controller 3 has an error detection and correction processing circuit, so it becomes possible to perform the error detection and correction processing of the read data from the flash memory and thereby reduce the processing on the host side. Further, by providing the FIFO inside the controller 3, it becomes possible to hold the match of timings of the data flow between the flash memory side and the host side.

Note that, in the above explanation, the flash memory 2 was configured, in a read operation, to make the RY/BY pins P2071 and P2072 the high level and transfer a ready signal RY to the external controller 3 when the preparations for the data requested to be read have been completed and state where a transfer command for outputting the data can be received is exhibited, and also to make the RY/BY pins P2071 and P2072 the low level and transfer a busy signal BY to the external controller 3 when the preparations for the data requested to be read have not been completed and state where a transfer command for outputting the data can be received is not exhibited so as to thereby enable the parallel control of the banks; but the present invention is not limited to this method of control.

Figure 13:
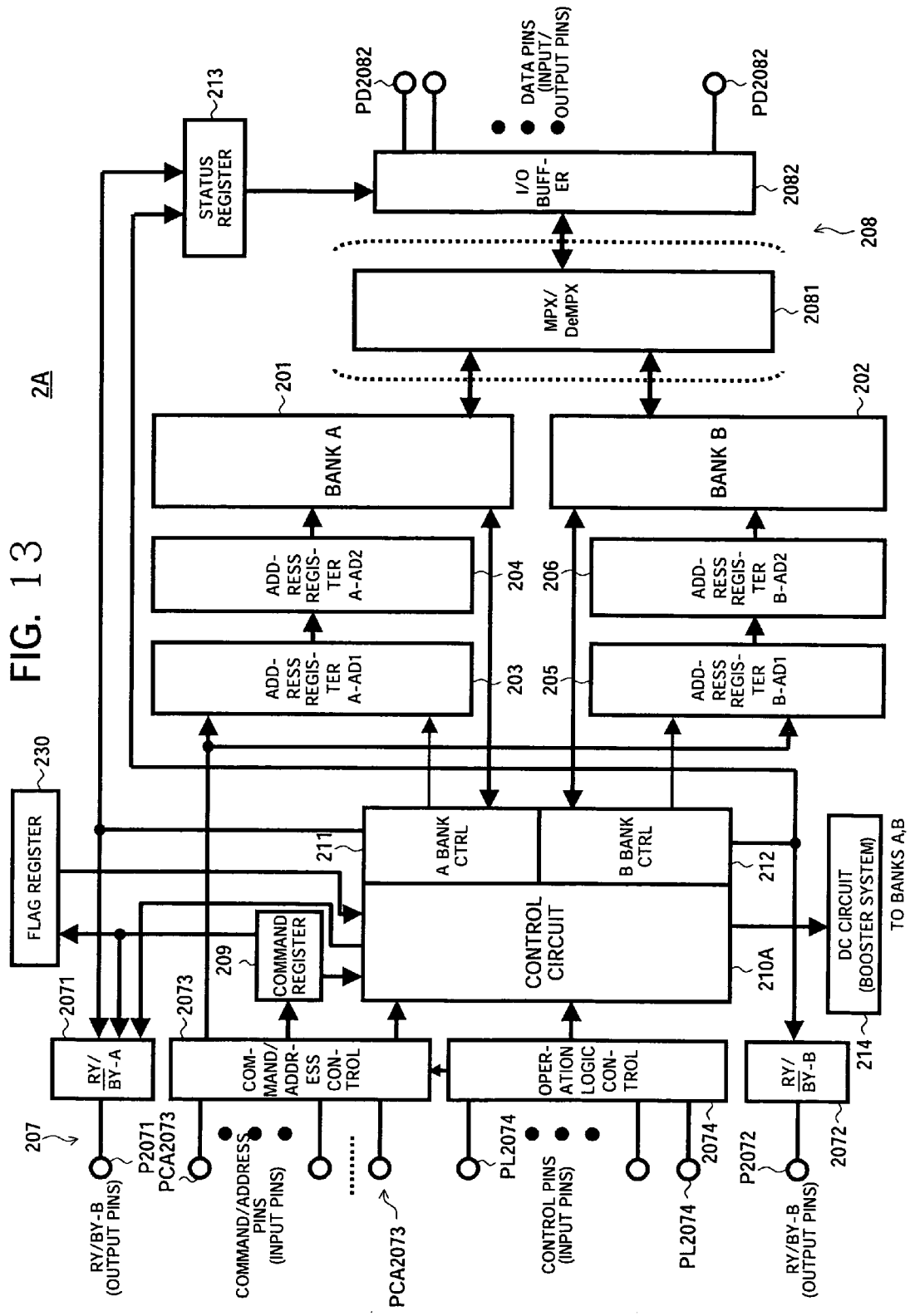
FIG. 13 is a block diagram of another example of the configuration of the NAND type flash memory of FIG. 1.

For example, as shown in FIG. 13, a flash memory 2A for data transfer and access of the internal memory cell array in a pipeline manner provided with a function of automatically shifting the stage and starting the next access operation when the access operation ends, automatically shifting the stage by referring to the value of a flag register set by the reservation command, and changing the outside notification pin to a first status by the reservation command and changing it to a second status by the completion of the stage shift processing is also possible.

FIG. 13 is a block diagram of an example of the configuration of the flash memory 2A provided with this automatic stage shift function.

In FIG. 13, a flag register 230 is connected to a command register 209, a control circuit 210A, and a ready (RY)/busy (BY) signal output portion 2071.

When the completion of the access of the memory cell array 221 is notified from the first bank control circuit 211 or the second bank control circuit 212 functioning as the access controller, the control circuit 210A refers to the reservation value set in the flag register 230, and performs the following processing to return the value to "0" when the value is "1". Namely, at the time of a data read operation, in FIG. 3, The data group stored in the data register of the data latch circuit 225 is transferred to the output use data register of the data latch circuit 226.

The column address values in the addresses stored in the address registers 204 and 206 are stored in the column address register, then the address values of the reservation use address registers 203 and 205 are transferred to the address registers 204 and 206.

An access instruction is sent to the first bank control circuit 211 or the second bank control circuit 212 serving as the access controller to start the next load operation of the memory cell array 221.

Further, the output portion 2071 of the ready (RY)/busy (BY) signal including the register connected to the outside notification pin P2071 is set to "1" to set the notification pin P2071 to the ready (REDY) state.

On the other hand, the control circuit 210A does not perform the stage shift processing when the flag register 230 is in the unreserved state, that is, "0", but stands by while maintaining the present state where the access is completed. Then, it waits for the reservation of for example the flag register 230 to be set and then shifts the stage.

The flag register 230 is reserved as follows. Namely, "1" is set when the command value input to the command register 209 is a specific value. At that time, the output portion 2071 of the ready (RY)/busy (BY) signal including the register is simultaneously set at "0" to set the notification pin P2071 to the BUSY state.

FIGS. 14A to 14D are views of an example of the data read operation from a single bank of such a flash memory 2A. In FIGS. 14A to 14D, the hatchings indicates the stage shift periods in the pipeline operation. FIG. 14A shows the input of a command and address (R1), FIG. 14B shows a read operation of the internal memory cell array (R2), FIG. 14C shows the data output (R3), and FIG. 14D shows the ready (RY)/busy (BY) signal.

1. When the read command and the address finish being input (21) for the first access <1>, the access <1> quickly shifts to the read stage (R2) of the memory cell array. Namely, the address is transferred (22) from the reservation use address register 203 (or 205) to the address register 204 (or 206), and the read operation (23) of the internal memory cell array 221 is commenced.

2. Here, the reservation command (24) for the next access <2> is input during the internal read operation, and the page address to be read out next is set in the address register 203 (or 205).

3. Further, when the reservation command (25) of the automatic stage shift processing is input, the outside notification signal (26) shifts to the busy (BUSY) state. Further, "1" is set in the flag register 230. Note that it is also possible to provide a command serving both as an access reservation command (24) and an automatic shift processing reservation command (25) and in that case input a command a single time to reserve both.

4. When the internal read operation (23) for the access <1> is completed, the stage is automatically shifted (27). Namely, the value of the address register 203 (or 205) is transferred to the address register 204 (or 206), the data of the data register of the data latch circuit 225 is transferred to the data register of the data latch circuit 226, and the internal read operation (28) for the access <2> is automatically commenced. Further, the outside notification signal (26) shifts to the READY state.

5. The controller 3 or the host device 4 detects and judges the ready (READY) state and starts the output of data (29) for the access <1>.

6. At the end of the access, only the command (30) of the automatic shift processing is input, along with which the outside notification signal (26) shifts to the busy (BUSY) state, and "1" is set in the flag register 230.

7. When the read operation for the access <2> is completed, the stage is automatically shifted (31). Namely, the value of the address register 203 (or 205) is transferred to the address register 204 (or 206), and the data of the data register of the data latch circuit 225 is transferred to the data register of the data latch circuit 226. Note that when the access is not reserved, the next internal read operation is not carried out based on the separately provided register settings etc. The outside notification signal (26) shifts to the ready (READY) state.

8. The controller 3 or the host device 4 detects and judges the ready (READY) state and starts the output of data (32) for the access <2>.

In the above processing, continuous processing is carried out without interruption at the stage (R2) of the internal memory access, but this stage still becomes a bottleneck of the overall processing. For example, the data transfer stage (R3) operates only intermittently.

Below, an explanation will be given of processing enabling further higher speed data access by dividing the stage of this internal memory access into a plurality of stages and performing processing parallel to each other with reference to FIGS. 15A to 15D.

Note that, in this example, it is assumed that banks perform exactly the same operation differing only in the addresses and data. The control circuit serving as the memory access controller or the stage shift circuit is shared by a plurality of banks. In this case, the processings of the divided stages and the shift to the next stage are executed at the same timing for all banks. This is one of the simplest embodiments of introduction of a multi-bank configuration to the present embodiment. There are diverse possible variations of the operation of a plurality of banks other than this as will be explained later. In this case, when it is notified from the first bank control circuit 211 or the second bank control circuit 212 serving as the access controller that the memory cell arrays 221 of all banks have finished being accessed, the controller 210A refers to the reservation value set in the flag register 230. If that value is "1", it performs the following processing to return that value to "0".

Namely, at the time of a data read operation, it performs the following operation, explained for example for the bank 201, for all of the banks in the same way.

Transfers the data group stored in the data register of the data latch circuit 225 to the output use data register of the data latch circuit 226.

Stores the column address value in the address stored in the address register 204 in the column address register, then transfers the address value of the reservation use address register 203 to the address register 204.

When the above operations are finished for all bank units, it

Sends an access instruction to the first bank control circuit 211 serving as the access controller and makes the memory cell array 221 of each bank start the next read operation.

Makes the output portion 2071 of the ready (RY)/busy (BY) signal including the register connected to the outside notification pin P2071 "1" to set the notification pin P2071 to the ready (READY) state.

On the other hand, the control circuit 210A does not perform the stage shift processing, but stands by while maintaining the present state where the access is completed when the flag register 230 is in an unreserved state, that is, "0". Then, it waits for the reservation of for example the flag register 230 to be set and then shifts the stage.

The flag register 230 is reserved as follows. Namely, it is set at "1" when the command value input to the command register 209 is a specific value. Further, at that time, the output portion 2071 of the ready (RY)/busy (BY) signal including the register is simultaneously set at "0" to set the notification pin P2071 to the busy (BUSY) state.

FIGS. 15A to 15D are diagrams of an example of a data read operation from a plurality of banks of such a flash memory 2A. In FIGS. 15A to 15D, the hatchings indicate the stage shift periods in the pipeline operation. Further, FIG. 15A shows the input of a command and address (R1), FIG. 15B shows a read operation of the internal memory cell array (R2), FIG. 15C shows the output of data (R3), and FIG. 15D shows the ready (RY)/busy (BY) signal. In the present example, a two-bank configuration is assumed as in FIG. 13, accesses <1> and <3> are processed in the bank 201, and accesses <2> and <4> are processed in the bank 202.

1. When the input (41) of an address for the first accesses <1> and <2> is completed, the accesses <1> and <2> immediately shift to the read stage (R2) of the memory cell arrays 201 and 202. Namely, in the banks, the addresses are transferred (42) from the reservation use address registers 203 and 205 to the address registers 204 and 206 and read operations (43) and (44) of the internal memory cell array 221 are commenced.

2. Here, reservation commands (45) for the next accesses <3> and <4> are input during the internal read operations, and the page addresses to be read next are set in the reservation use address registers 203 and 205 of the banks.

3. Further, when the reservation command (46) of the automatic stage shift processing is input, the outside notification signal (56) shifts to the busy (BUSY) state along with that. Further, "1" is set in the flag register 230. Note that, it is also possible to provide a command serving as both the access reservation command (45) and the reservation command (46) of the automatic shift processing. In that case, input of a command one time enables reservation of both.

4. When both of the internal read operations (43) and (44) for the accesses <1> and <2> are completed, the stage is automatically shifted (47). Namely, in the banks 201 and 202, the transfer between the address registers 203 and 204, between 205 and 206, and between the data registers of the data latch circuits 225 and 226 is carried out, and the internal read operations (48) and (49) for the accesses <3> and <4> are automatically commenced. Further, the outside notification signal (56) shifts to the ready (READY) state.

5. The controller 3 or the host device 4 detects and judges the ready (READY) state and sequentially outputs the data (50) and (51) for the accesses <1> and <2>.

6. At the end of the access, only the reservation command (52) of the automatic shift processing is input, along with which outside notification signal (56) shifts to the busy (BUSY) state, and "1" is set in the flag register 230.

7. When both of the internal read operations (48) and (49) for the accesses <3> and <4> are completed, the stage is automatically shifted (53). Namely, in the banks 201 and 202, the transfer between the address registers 203 and 204, between 205 and 206, and between the data registers of the data latch circuits 225 and 226 is carried out. Note that when the access is not reserved, the next internal read operation is not carried out based on the separately provided register settings etc. The outside notification signal (56) shifts to the ready (READY) state.

8. The host detects and judges the READY state and starts the output of the data (54) and (55) for the accesses <3> and <4>.

In this way, a variety of combinations of multi-bank operations can be considered. In the above embodiments, examples of specific use relating to the requirements of the embodiment of the present invention, that is, Automatic stage shift processing
Command reservation of stage shift described above,
External notification at the time of occurrence of the stage shift described above, and
Combination with multi-bank processing accompanying pipeline memory access were explained along with the effects on the efficiency of data access at that time. The embodiment of the present invention is not however limited to the variations of the portion for achievement explained here.

Further, the embodiment of the present invention is not limited to flash memories and may be applied to all semiconductor memories with slow random access at the memory cell level. In recent years, nonvolatile memories using organic ferroelectric materials and other semiconductor memories made of inexpensive new materials have been proposed. Some of them are slow in access speed of the memory cells. Attempts are being made to make up for the slow access speed by parallel processing in the same way as NAND type flash memories. It is possible to effectively apply the embodiment of the present invention to such semiconductor memories.

As described above, in a memory device employing the configurations and functions of FIG. 13 to FIG. 15, in the read and write operations, pipeline operation for input/output of data and for access to the internal memory array can be efficiently and suitably executed. Due to this, it is possible to greatly improve the effective transfer speed of the data. Namely, by providing registers for storing the reserved address and registers exclusively for output separate from the registers for the memory array access, the pipeline operation can be smoothly executed. Further, by providing a function for automatically shifting the stages of the pipeline along with the completion of memory array access and starting the next memory access, the memory access steps which become the bottleneck in transfer can be continuously processed without interruption, and the maximum transfer efficiency may be obtained. Further, by performing these automatic processings by referring to a flag previously set by the reservation command, safe and flexible data access and efficient data transfer may be both achieved. Further, by providing the external notification pins and providing a function shifting them to the BUSY state by the reservation command and to the READY state by the stage shift by the automatic processing described above, the host can easily judge the input/output timings of the data and perform smooth data transfer.

Note that, in the present embodiment, the explanation was given of the case of two banks as an the example, but needless to say the present invention may be applied to a semiconductor memory device provided with a larger number of banks, for example, four or eight banks.

Summarizing the effects of the embodiment, according to the present embodiment, by providing a plurality of address holding portions (registers) corresponding to the banks, it becomes possible to fetch in advance an address which will become necessary for the next read operation and possible to continuously access data in a time sequence. Further, by providing a plurality of banks and making the random access time of a read operation seem to disappear, a high speed read operation is enabled. Further, by controlling a pair of ready signal/busy signals corresponding to a plurality of banks, it becomes possible to control banks in parallel. Further, by providing a plurality of data holding portions, it becomes possible to fetch data corresponding to the next address during the current read operation. Further, it is possible to separate the read commands and the read data output commands, and it becomes possible to issue commands to a plurality of banks.

It should be understood by those skilled in the art which various modifications, combinations, sub-combinations and alterations may occur depending on design requirements and other factors insofar as they are within the scope of the appended claims or the equivalents thereof.

What we claim is:

1. A semiconductor memory device comprising:
a current address holding portion for holding an address for reading data,
a cell array formed by memory cells arrayed in a matrix and reading out data in accordance with an address held in the current address holding portion,
a reserved address holding portion receiving in advance at least a reserved address for the next read operation from outside the semiconductor memory device holding the reserved address,
a data holding portion for holding the data read out from the cell array and for transferring the held data to the outside at a predetermined timing, and a control circuit for making the current address holding portion hold the reserved address held in the reserved address holding portion, making the data be read out from the cell array, and making the data holding portion hold the data when the data read out from the cell array corresponding to the address held in the current address holding portion and held in the data holding portion is ready to be transferred to the outside, wherein the control circuit outputs a busy signal indicating a busy state to the outside when preparations for transfer of the read out data have not been completed until the data is read out corresponding to the address held in the current address holding portion and the data holding portion is ready to transfer the held data to the outside, and the reserved address holding portion holds a reserved address upon receipt of the reserved address from the outside even in the busy state.

2. The semiconductor memory device as set forth in claim 1, wherein the control circuit makes the data holding portion transfer the held data to the outside by a control signal when the data held in the data holding portion is ready to be transferred to the outside.

3. The semiconductor memory device as set forth in claim 1, wherein the control circuit reads out data corresponding to the address held in the current address holding portion and outputs a ready signal indicating a ready state when the preparations for the transfer of the read out data to the outside have been completed when the data held in the data holding portion is ready to be transferred to the outside.

4. The semiconductor memory device as set forth in claim 3, wherein the control circuit transfers the held data from the data holding portion to the outside by a control signal when the data held in the data holding portion is ready to be transferred to the outside and receives a command instructing the transfer of the data to the outside from the outside after outputting the ready signal.

5. The semiconductor memory device as set forth in claim 1, wherein the data holding portion includes:

a first latch circuit for holding the data read out from the cell array; and a second latch circuit to which the held data of the first latch circuit is transferred at a predetermined timing and which holds the transferred data, wherein the read out data is ready to be transferred to the outside when the data is held in the second latch circuit.

6. The semiconductor memory device as set forth in claim 3, wherein the data holding portion includes:

a first latch circuit for holding the data read out from the cell array; and a second latch circuit to which the held data of the first latch circuit is transferred at a predetermined timing and which holds the transferred data, wherein the read out data is ready to be transferred to the outside when the data is held in the second latch circuit, and wherein the control circuit outputs the ready signal to the outside when the read out data is held in the second latch circuit and is ready to be transferred to the outside.

7. The semiconductor memory device as set forth in claim 4, wherein the data holding portion includes:

a first latch circuit for holding the data read out from the cell array; and a second latch circuit to which the held data of the first latch circuit is transferred at a predetermined timing and which holds the transferred data, wherein the read out data is ready to be transferred to the outside when the data is held in the second latch circuit, and wherein the control circuit outputs the ready signal to the outside when the read out data is held in the second latch circuit and is ready to be transferred to the outside and transfers the held data of the second latch circuit to the outside by a control signal when receiving a command instructing the transfer of the data to the outside from the outside.

8. The semiconductor memory device as set forth in claim 5, wherein:

the device comprises a flag register, the control circuit performs internal processing for internally automatically executing the transfer of an address from the reserved address holding portion to the current address holding portion and the transfer of data from the first latch circuit to the second latch circuit when the data finishes being read from the cell array and starting the read operation of the next data from the cell array, the internal processing is carried out by referring to a value of the flag register set by the previously input reservation command, and the processing is executed only when the flag value is a predetermined value.

9. The semiconductor memory device as set forth in claim 8, wherein:

the device further comprises a status notification pin, and the notification pin enters the busy state in response to an input of a reservation command and enters a ready state in response to execution of the internal processing.

10. The semiconductor memory device as set forth in claim 8, wherein even when the data finishes being read from the cell array, the control circuit waits for reservation to the flag register by input of a command before executing the internal processing when no reservation has yet been made to the flag register.

11. The semiconductor memory device as set forth in claim 1, wherein the device has a status register accessed from the outside and in which a present operation situation is stored.

12. A semiconductor memory device, comprising:

a plurality of banks each including:

a cell array formed by memory cells arrayed in a matrix and reading out data in accordance with an address; and a data holding portion for holding the data read out from the cell array and which transfers the held data outside the semiconductor memory device at a predetermined timing and, provided corresponding to each of the plurality of banks, a current address holding portion for holding an address for reading data of the cell array, a reserved address holding portion receiving in advance at least a reserved address for the next read operation from the outside holding the reserved address, and a bank control circuit for making the current address holding portion hold the reserved address held in the reserved address holding portion, making the data be read out from the cell array, and making the data holding portion hold the data when the data read out from the cell array corresponding to the address held in the current address holding portion and held in the data holding portion is ready to be transferred to the outside, wherein the bank control circuit corresponding to each bank outputs a busy signal indicating the busy state to the outside when preparations for the transfer of the read out data has not been completed until the data is read out corresponding to the address held in the current address holding portion and the data holding portion is ready to transfer the held data to the outside, and the reserved address holding portion corresponding to each bank holds the reserved address upon receipt of the reserved address from the outside even in the busy state.

13. The semiconductor memory device as set forth in claim 12, wherein the bank control circuit corresponding to each bank makes the data holding portion transfer the held data to the outside by a control signal during a period where data is not transferred from another bank to the outside when the data held in the data holding portion is ready to be transferred to the outside.

14. The semiconductor memory device as set forth in claim 12, wherein the bank control circuit corresponding to each bank outputs a ready signal indicating the ready state to the outside when the preparations for transfer of the read out data have been completed when the data is read out corresponding to the address held in the current address holding portion and the data held in the data holding portion are ready to be transferred to the outside.

15. The semiconductor memory device as set forth in claim 14, wherein the bank control circuit corresponding to each bank transfers the held data from the data holding portion to the outside by a control signal during a period where data is not transferred from another bank to the outside when the data held in the data holding portion is ready to be transferred to the outside and receives a command instructing the transfer of data to the outside from the outside after outputting the ready signal.

16. The semiconductor memory device as set forth in claim 12, wherein the data holding portion of each bank includes:
a first latch circuit for holding the data read out from the cell array; and
a second latch circuit to which the held data of the first latch circuit is transferred at a predetermined timing and which holds the transferred data, wherein
the read out data is ready to be transferred to the outside when the data is held in the second latch circuit.

17. The semiconductor memory device as set forth in claim 14, wherein the data holding portion of each bank includes:
a first latch circuit for holding the data read out from the cell array; and a second latch circuit to which the held data of the first latch circuit is transferred at a predetermined timing and which holds the transferred data, wherein
the read out data is ready to be transferred to the outside when the data is held in the second latch circuit, and wherein
the bank control circuit corresponding to each bank outputs the ready signal to the outside when the read out data is held in the second latch circuit and is ready to be transferred to the outside.

18. The semiconductor memory device as set forth in claim 15, wherein the data holding portion of each bank includes:
a first latch circuit for holding the data read out from the cell array; and a second latch circuit to which the held data of the first latch circuit is transferred at a predetermined timing and which holds the transferred data, wherein the read out data is ready to be transferred to the outside when the data is held in the second latch circuit, and wherein the bank control circuit corresponding to each bank outputs the ready signal to the outside when the read out data is held in the second latch circuit and is ready to be transferred to the outside and transfers the held data in the second latch circuit to the outside by a control signal during the period when data is not transferred from another bank to the outside when receiving a command instructing the transfer of the data to the outside from the outside.

19. The semiconductor memory device as set forth in claim 16, wherein:
the device comprises a flag register,
the control circuit performs internal processing for internally automatically executing the transfer of an address from the reserved address holding portion to the current address holding portion and the transfer of data from the first latch circuit to the second latch circuit and starting the read operation of the next data from the cell array for a bank for which the read operation of data from the cell array is completed,
the internal processing is carried out by referring to a value of the flag register set by the previously input reservation command, and
the processing is executed only when the flag value is a predetermined value.

20. The semiconductor memory device as set forth in claim 19, wherein:
the device further comprises a status notification pin, and
the notification pin enters the busy state in response to an input of a reservation command and enters a ready state in response to execution of the internal processing.

21. The semiconductor memory device as set forth in claim 19, wherein even when the data finishes being read from the cell array at any bank, the control circuit waits for reservation to the flag register by input of a command before executing the internal processing when no reservation has yet been made to the flag register.

22. The semiconductor memory device as set forth in claim 12, wherein the device has a status register accessed from the outside and in which a present operation situation is stored.

23. A signal processing system comprising:
a first semiconductor memory device;
a second semiconductor memory device to which stored data of the first semiconductor memory device is read out;
a host device for controlling access of the first and second semiconductor memory devices and performing predetermined signal processing according to the data stored in the second semiconductor memory device; and
a controller for controlling an access request from the host device to the first semiconductor memory device, wherein
the first semiconductor memory device comprises:
a current address holding portion for holding an address for reading data;
a cell array formed by memory cells arrayed in a matrix and reading out the data in accordance with an address held in the current address holding portion;
a reserved address holding portion receiving in advance at least a reserved address for the next read operation from outside the first semiconductor memory device and holding the reserved address, a data holding portion for holding the data read out from the cell array and for transferring the held data to the outside at a predetermined timing, and a control circuit for making the current address holding portion hold the reserved address held in the reserved address holding portion, making the data be read out from the cell array, and making the data holding portion hold the data when the data read out from the cell array corresponding to the address held in the current address holding portion and held in the data holding portion is ready to be transferred to the outside, wherein the control circuit outputs a busy signal indicating a busy state to the outside when preparations for transfer of the read out data have not been completed until the data is read out corresponding to the address held in the current address holding portion and the data holding portion is ready to transfer the held data to the outside by the data holding portion, and the reserved address holding portion holds a reserved address upon receipt of the reserved address from the outside even in the busy state.

24. A signal processing system comprising:

a first semiconductor memory device, a second semiconductor memory device to which stored data of the first semiconductor memory device is read out, a host device for controlling access of the first and second semiconductor memory devices and performing predetermined signal processing according to the data stored in the second semiconductor memory device, and a controller for controlling an access request from the host device to the first semiconductor memory device, wherein the first semiconductor memory device comprises:

a plurality of banks each including:

a cell array formed by memory cells arrayed in a matrix and reading out data in accordance with an address; and a data holding portion for holding the data read out from the cell array and which transfers the held data outside the first semiconductor memory device at a predetermined timing, and provided corresponding to each of the plurality of banks, a current address holding portion for holding an address for reading data of the cell array, a reserved address holding portion receiving in advance at least a reserved address for the next read operation from the outside and holding the reserved address, and a bank control circuit for making the current address holding portion hold the reserved address held in the reserved address holding portion, making the data be read out from the cell array, and making the data holding portion hold the data when the data read out from the cell array corresponding to the address held in the current address holding portion and held in the data holding portion is ready to be transferred to the outside, wherein the bank control circuit corresponding to each bank outputs a busy signal indicating the busy state to the outside when preparations for the transfer of the read out data has not been completed until the data is read out corresponding to the address held in the current address holding portion and the held data is ready to be transferred to the outside by the data holding portion, and the reserved address holding portion corresponding to each bank holds the reserved address upon receipt of the reserved address from the outside even in the busy state.

25. A semiconductor memory device comprising:

a current address holding portion for holding an address for reading data, a cell array formed by memory cells arrayed in a matrix and reading out data in accordance with an address held in the current address holding portion, a reserved address holding portion receiving in advance at least a reserved address for the next read operation from outside the semiconductor memory device and holding the reserved address, a data holding portion for holding the data read out from the cell array and for transferring the held data to the outside at a predetermined timing, and a control circuit for making the current address holding portion hold the reserved address held in the reserved address holding portion, making the data be read out from the cell array, and making the data holding portion hold the data when the data read out from the cell array corresponding to the address held in the current address holding portion and held in the data holding portion is ready to be transferred to the outside, the data holding portion including:

a first latch circuit for holding the data read out from the cell array; and a second latch circuit to which the held data of the first latch circuit is transferred at a predetermined timing and which holds the transferred data, wherein the read out data is ready to be transferred to the outside when the data is held in the second latch circuit, the device comprises a flag register, the control circuit performs internal processing for internally automatically executing the transfer of an address from the reserved address holding portion to the current address holding portion and the transfer of data from the first latch circuit to the second latch circuit when the data finishes being read from the cell array and starting the read operation of the next data from the cell array, the internal processing is carried out by referring to a value of the flag register set by the previously input reservation command, and the processing is executed only when the flag value is a predetermined value.

* * * * *

UNITED STATES PATENT AND TRADEMARK OFFICE
CERTIFICATE OF CORRECTION

PATENT NO. : 7,283,405 B2 Page 1 of 1
APPLICATION NO. : 11/126302
DATED : October 16, 2007
INVENTOR(S) : Hidetoshi Yamanaka et al.

It is certified that error appears in the above-identified patent and that said Letters Patent is hereby corrected as shown below:

Title Page:
Item (54) should be read as follows:
-- PIPELINED MEMORY DEVICE WITH MULTIPLE BANKS --.

Signed and Sealed this

Eighth Day of April, 2008

JON W. DUDAS
*Director of the United States Patent and Trademark Office*

UNITED STATES PATENT AND TRADEMARK OFFICE
CERTIFICATE OF CORRECTION

PATENT NO. : 7,283,405 B2 Page 1 of 1
APPLICATION NO. : 11/126302
DATED : October 16, 2007
INVENTOR(S) : Hidetoshi Yamanaka et al.

It is certified that error appears in the above-identified patent and that said Letters Patent is hereby corrected as shown below:

Title Page and Column 1, lines 1 and 2:
Item (54) should be read as follows:
-- PIPELINED MEMORY DEVICE WITH MULTIPLE BANKS --.

This certificate supersedes the Certificate of Correction issued April 8, 2008.

Signed and Sealed this

Sixth Day of May, 2008

JON W. DUDAS
*Director of the United States Patent and Trademark Office*